(12) United States Patent
Ermez et al.

(10) Patent No.: US 12,237,221 B2
(45) Date of Patent: Feb. 25, 2025

(54) NUCLEATION-FREE TUNGSTEN DEPOSITION

(71) Applicant: Lam Research Corporation, Fremont, CA (US)

(72) Inventors: Sema Ermez, Santa Clara, CA (US); Ruopeng Deng, San Jose, CA (US); Yutaka Nishioka, Saijo-cho (JP); Xiaolan Ba, Fremont, CA (US); Sanjay Gopinath, Fremont, CA (US); Michal Danek, Cupertino, CA (US)

(73) Assignee: Lam Research Corporation, Fremont, CA (US)

( * ) Notice: Subject to any disclaimer, the term of this patent is extended or adjusted under 35 U.S.C. 154(b) by 474 days.

(21) Appl. No.: 17/595,590

(22) PCT Filed: May 18, 2020

(86) PCT No.: PCT/US2020/033461
§ 371 (c)(1),
(2) Date: Nov. 19, 2021

(87) PCT Pub. No.: WO2020/236749
PCT Pub. Date: Nov. 26, 2020

(65) Prior Publication Data
US 2022/0254685 A1 Aug. 11, 2022

Related U.S. Application Data

(60) Provisional application No. 62/851,552, filed on May 22, 2019.

(51) Int. Cl.
*H01L 21/768* (2006.01)
*C23C 16/08* (2006.01)
(Continued)

(52) U.S. Cl.
CPC ........ *H01L 21/76876* (2013.01); *C23C 16/08* (2013.01); *C23C 16/45525* (2013.01); *H01L 21/28568* (2013.01)

(58) Field of Classification Search
CPC ................ H01L 21/76876; C23C 16/45525
See application file for complete search history.

(56) References Cited

U.S. PATENT DOCUMENTS 4,746,375 A 5/1988 Iacovangelo
4,804,560 A 2/1989 Shioya et al.
(Continued)

FOREIGN PATENT DOCUMENTS

CN 1455447 A 11/2003
CN 101154576 A 4/2008
(Continued)

OTHER PUBLICATIONS

Aldjapan.com "Principle—ALD Japan, Inc." [webpage] pp. 1-10. [retrieved from URL: https://aldjapan.com/%E5%8E%9F%E7%90%86/].
(Continued)

*Primary Examiner* — Jay C Chang
*Assistant Examiner* — Mikka Liu
(74) *Attorney, Agent, or Firm* — Weaver Austin Villeneuve & Sampson LLP

(57) ABSTRACT

Provided herein are methods of depositing tungsten (W) films without depositing a nucleation layer. In certain embodiments, the methods involve depositing a conformal reducing agent layer of boron (B) and/or silicon (Si) on a substrate. The substrate generally includes a feature to be filled with tungsten with the reducing agent layer conformal to the topography of the substrate including the feature. The reducing agent layer is then exposed to a fluorine-containing tungsten precursor, which is reduced by the reducing agent
(Continued)

layer to form a layer of elemental tungsten. The conformal reducing agent layer is converted to a conformal tungsten layer.

20 Claims, 16 Drawing Sheets

(51) Int. Cl.
*C23C 16/455* (2006.01)
*H01L 21/285* (2006.01)

(56) References Cited

U.S. PATENT DOCUMENTS

| | | | |
|---|---|---|---|
| 4,874,719 A | 10/1989 | Kurosawa | |
| 4,962,063 A | 10/1990 | Maydan et al. | |
| 5,028,565 A | 7/1991 | Chang et al. | |
| 5,227,329 A | 7/1993 | Kobayashi et al. | |
| 5,250,329 A | 10/1993 | Miracky et al. | |
| 5,250,467 A | 10/1993 | Somekh et al. | |
| 5,308,655 A | 5/1994 | Eichman et al. | |
| 5,326,723 A | 7/1994 | Petro et al. | |
| 5,370,739 A | 12/1994 | Foster et al. | |
| 5,391,394 A | 2/1995 | Hansen | |
| 5,567,583 A | 10/1996 | Wang et al. | |
| 5,633,200 A | 5/1997 | Hu | |
| 5,661,080 A | 8/1997 | Hwang et al. | |
| 5,726,096 A | 3/1998 | Jung | |
| 5,795,824 A | 8/1998 | Hancock | |
| 5,804,249 A | 9/1998 | Sukharev et al. | |
| 5,817,576 A | 10/1998 | Tseng et al. | |
| 5,833,817 A | 11/1998 | Tsai et al. | |
| 5,913,145 A | 6/1999 | Lu et al. | |
| 5,916,634 A | 6/1999 | Fleming et al. | |
| 5,926,720 A | 7/1999 | Zhao et al. | |
| 5,956,609 A | 9/1999 | Lee et al. | |
| 5,963,833 A | 10/1999 | Thakur | |
| 5,994,749 A | 11/1999 | Oda | |
| 6,001,729 A | 12/1999 | Shinriki et al. | |
| 6,017,818 A | 1/2000 | Lu | |
| 6,034,419 A | 3/2000 | Nicholls et al. | |
| 6,037,263 A | 3/2000 | Chang | |
| 6,066,366 A | 5/2000 | Berenbaum et al. | |
| 6,099,904 A | 8/2000 | Mak et al. | |
| 6,107,200 A | 8/2000 | Takagi et al. | |
| 6,143,082 A | 11/2000 | McInerney et al. | |
| 6,174,812 B1 | 1/2001 | Hsiung et al. | |
| 6,206,967 B1 | 3/2001 | Mak et al. | |
| 6,245,654 B1 | 6/2001 | Shih et al. | |
| 6,260,266 B1 | 7/2001 | Tamaki | |
| 6,265,312 B1 | 7/2001 | Sidhwa et al. | |
| 6,277,744 B1 | 8/2001 | Yuan et al. | |
| 6,284,316 B1 | 9/2001 | Sandhu et al. | |
| 6,287,965 B1 | 9/2001 | Kang et al. | |
| 6,294,468 B1 | 9/2001 | Gould-Choquette et al. | |
| 6,297,152 B1 | 10/2001 | Itoh et al. | |
| 6,306,211 B1 | 10/2001 | Takahashi et al. | |
| 6,309,964 B1 | 10/2001 | Tsai et al. | |
| 6,309,966 B1 | 10/2001 | Govindarajan et al. | |
| 6,310,300 B1 | 10/2001 | Cooney, III et al. | |
| 6,340,629 B1 | 1/2002 | Yeo et al. | |
| 6,355,558 B1 | 3/2002 | Dixit et al. | |
| 6,404,054 B1 | 6/2002 | Oh et al. | |
| 6,429,126 B1 | 8/2002 | Herner et al. | |
| 6,465,347 B2 | 10/2002 | Ishizuka et al. | |
| 6,491,978 B1 | 12/2002 | Kalyanam | |
| 6,551,929 B1 | 4/2003 | Kori et al. | |
| 6,566,250 B1 | 5/2003 | Tu et al. | |
| 6,566,262 B1 | 5/2003 | Rissman et al. | |
| 6,581,258 B2 | 6/2003 | Yoneda et al. | |
| 6,593,233 B1 | 7/2003 | Miyazaki et al. | |
| 6,607,976 B2 | 8/2003 | Chen et al. | |
| 6,635,965 B1 | 10/2003 | Lee et al. | |
| 6,706,625 B1 | 3/2004 | Sudijono et al. | |
| 6,720,261 B1 | 4/2004 | Anderson et al. | |
| 6,740,585 B2 | 5/2004 | Yoon et al. | |
| 6,777,331 B2 | 8/2004 | Nguyen | |
| 6,790,773 B1 | 9/2004 | Drewery et al. | |
| 6,794,287 B2 | 9/2004 | Saanila et al. | |
| 6,797,340 B2 | 9/2004 | Fang et al. | |
| 6,844,258 B1 | 1/2005 | Fair et al. | |
| 6,861,356 B2 | 3/2005 | Matsuse et al. | |
| 6,902,763 B1 | 6/2005 | Elers et al. | |
| 6,903,016 B2 | 6/2005 | Cohen | |
| 6,905,543 B1 | 6/2005 | Fair et al. | |
| 6,908,848 B2 | 6/2005 | Koo | |
| 6,936,538 B2 | 8/2005 | Byun | |
| 6,939,804 B2 | 9/2005 | Lai et al. | |
| 6,962,873 B1 | 11/2005 | Park | |
| 7,005,372 B2 | 2/2006 | Levy et al. | |
| 7,141,494 B2 | 11/2006 | Lee et al. | |
| 7,157,798 B1 | 1/2007 | Fair et al. | |
| 7,211,144 B2 | 5/2007 | Lu et al. | |
| 7,220,671 B2 | 5/2007 | Simka et al. | |
| 7,235,486 B2 | 6/2007 | Kori et al. | |
| 7,262,125 B2 | 8/2007 | Wongsenakhum et al. | |
| 7,338,900 B2 | 3/2008 | Mizuno et al. | |
| 7,355,254 B2 | 4/2008 | Datta et al. | |
| 7,405,158 B2 | 7/2008 | Lai et al. | |
| 7,416,979 B2 | 8/2008 | Yoon et al. | |
| 7,419,904 B2 | 9/2008 | Kato | |
| 7,429,402 B2 | 9/2008 | Gandikota et al. | |
| 7,465,665 B2 | 12/2008 | Xi et al. | |
| 7,465,666 B2 | 12/2008 | Kori et al. | |
| 7,485,340 B2 | 2/2009 | Elers et al. | |
| 7,501,343 B2 | 3/2009 | Byun et al. | |
| 7,501,344 B2 | 3/2009 | Byun et al. | |
| 7,563,718 B2 | 7/2009 | Kim | |
| 7,589,017 B2 | 9/2009 | Chan et al. | |
| 7,595,263 B2 | 9/2009 | Chung et al. | |
| 7,605,083 B2 | 10/2009 | Lai et al. | |
| 7,611,990 B2 | 11/2009 | Yoon et al. | |
| 7,655,567 B1 | 2/2010 | Gao et al. | |
| 7,674,715 B2 | 3/2010 | Kori et al. | |
| 7,675,119 B2 | 3/2010 | Taguwa | |
| 7,691,749 B2 | 4/2010 | Levy et al. | |
| 7,695,563 B2 | 4/2010 | Lu et al. | |
| 7,709,385 B2 | 5/2010 | Xi et al. | |
| 7,732,327 B2 | 6/2010 | Lee et al. | |
| 7,745,329 B2 | 6/2010 | Wang et al. | |
| 7,745,333 B2 | 6/2010 | Lai et al. | |
| 7,749,815 B2 | 7/2010 | Byun | |
| 7,754,604 B2 | 7/2010 | Wongsenakhum et al. | |
| 7,772,114 B2 | 8/2010 | Chan et al. | |
| 7,955,972 B2 | 6/2011 | Chan et al. | |
| 7,964,505 B2 | 6/2011 | Khandelwal et al. | |
| 7,977,243 B2 | 7/2011 | Sakamoto et al. | |
| 8,048,805 B2 | 11/2011 | Chan et al. | |
| 8,053,365 B2 | 11/2011 | Humayun et al. | |
| 8,058,170 B2 | 11/2011 | Chandrashekar et al. | |
| 8,062,977 B1 | 11/2011 | Ashtiani et al. | |
| 8,071,478 B2 | 12/2011 | Wu et al. | |
| 8,087,966 B2 | 1/2012 | Hebbinghaus et al. | |
| 8,101,521 B1 | 1/2012 | Gao et al. | |
| 8,110,877 B2 | 2/2012 | Mukherjee et al. | |
| 8,119,527 B1 | 2/2012 | Chadrashekar et al. | |
| 8,129,270 B2 | 3/2012 | Chandrashekar et al. | |
| 8,207,062 B2 | 6/2012 | Gao et al. | |
| 8,258,057 B2 | 9/2012 | Kuhn et al. | |
| 8,329,576 B2 | 12/2012 | Chan et al. | |
| 8,367,546 B2 | 2/2013 | Humayun et al. | |
| 8,409,985 B2 | 4/2013 | Chan et al. | |
| 8,409,987 B2 | 4/2013 | Chandrashekar et al. | |
| 8,551,885 B2 | 10/2013 | Chen et al. | |
| 8,623,733 B2 | 1/2014 | Chen et al. | |
| 8,709,948 B2 | 4/2014 | Danek et al. | |
| 8,853,080 B2 | 10/2014 | Guan et al. | |
| 8,975,184 B2 | 3/2015 | Chen et al. | |
| 8,993,055 B2 | 3/2015 | Rahtu et al. | |
| 9,034,760 B2 | 5/2015 | Chen et al. | |
| 9,064,684 B1 | 6/2015 | Mui et al. | |
| 9,076,843 B2 | 7/2015 | Lee et al. | |
| 9,153,486 B2 | 10/2015 | Arghavani et al. | |
| 9,159,571 B2 | 10/2015 | Humayun et al. | |

(56) References Cited

U.S. PATENT DOCUMENTS

| | | |
|---|---|---|
| 9,236,297 B2 | 1/2016 | Chen et al. |
| 9,240,347 B2 | 1/2016 | Chandrashekar et al. |
| 9,583,385 B2 | 2/2017 | Lee et al. |
| 9,589,808 B2 | 3/2017 | Bamnolker et al. |
| 9,613,818 B2 | 4/2017 | Ba et al. |
| 9,653,353 B2 | 5/2017 | Chandrashekar et al. |
| 9,673,146 B2 | 6/2017 | Chen et al. |
| 9,748,105 B2 | 8/2017 | Wu et al. |
| 9,754,824 B2 | 9/2017 | Schloss et al. |
| 9,969,622 B2 | 5/2018 | Lei et al. |
| 9,978,605 B2 | 5/2018 | Bamnolker et al. |
| 10,103,058 B2 | 10/2018 | Chandrashekar et al. |
| 10,546,751 B2 | 1/2020 | Bamnolker et al. |
| 11,348,795 B2 | 5/2022 | Schloss et al. |
| 11,549,175 B2 | 1/2023 | Butail et al. |
| 11,972,952 B2 | 4/2024 | Deng et al. |
| 12,002,679 B2 | 6/2024 | Bowes et al. |
| 2001/0007797 A1 | 7/2001 | Jang et al. |
| 2001/0008808 A1 | 7/2001 | Gonzalez |
| 2001/0014533 A1 | 8/2001 | Sun |
| 2001/0015494 A1 | 8/2001 | Ahn |
| 2001/0044041 A1 | 11/2001 | Badding et al. |
| 2002/0037630 A1 | 3/2002 | Agarwal et al. |
| 2002/0048938 A1 | 4/2002 | Ishizuka et al. |
| 2002/0090796 A1 | 7/2002 | Desai et al. |
| 2002/0117399 A1 | 8/2002 | Chen et al. |
| 2002/0155722 A1 | 10/2002 | Satta et al. |
| 2002/0168840 A1 | 11/2002 | Hong et al. |
| 2002/0177316 A1 | 11/2002 | Miller et al. |
| 2002/0190379 A1 | 12/2002 | Jian et al. |
| 2002/0192953 A1 | 12/2002 | Wang et al. |
| 2003/0013300 A1 | 1/2003 | Byun |
| 2003/0059980 A1 | 3/2003 | Chen et al. |
| 2003/0082296 A1 | 5/2003 | Elers et al. |
| 2003/0082902 A1 | 5/2003 | Fukui et al. |
| 2003/0091870 A1 | 5/2003 | Bhowmik et al. |
| 2003/0104126 A1 | 6/2003 | Fang et al. |
| 2003/0123216 A1 | 7/2003 | Yoon et al. |
| 2003/0127043 A1 | 7/2003 | Lu et al. |
| 2003/0129828 A1 | 7/2003 | Cohen |
| 2003/0190802 A1 | 10/2003 | Wang et al. |
| 2003/0209193 A1 | 11/2003 | Van Wijck |
| 2003/0224217 A1 | 12/2003 | Byun et al. |
| 2004/0014315 A1 | 1/2004 | Lai et al. |
| 2004/0044127 A1 | 3/2004 | Okubo et al. |
| 2004/0142557 A1 | 7/2004 | Levy et al. |
| 2004/0151845 A1 | 8/2004 | Nguyen et al. |
| 2004/0202786 A1 | 10/2004 | Wongsenakhum et al. |
| 2004/0206267 A1 | 10/2004 | Sambasivan et al. |
| 2004/0247788 A1 | 12/2004 | Fang et al. |
| 2005/0009325 A1 | 1/2005 | Chung et al. |
| 2005/0031786 A1 | 2/2005 | Lee et al. |
| 2005/0059236 A1 | 3/2005 | Nishida et al. |
| 2005/0059241 A1 | 3/2005 | Kori et al. |
| 2005/0136594 A1 | 6/2005 | Kim |
| 2005/0191803 A1 | 9/2005 | Matsuse et al. |
| 2006/0003581 A1 | 1/2006 | Johnston et al. |
| 2006/0009034 A1 | 1/2006 | Lai et al. |
| 2006/0040052 A1 | 2/2006 | Fang et al. |
| 2006/0094238 A1 | 5/2006 | Levy et al. |
| 2006/0145190 A1 | 7/2006 | Salzman et al. |
| 2006/0211244 A1 | 9/2006 | Deshpande et al. |
| 2006/0265100 A1 | 11/2006 | Li |
| 2006/0284317 A1 | 12/2006 | Ito et al. |
| 2007/0009658 A1 | 1/2007 | Yoo et al. |
| 2007/0087560 A1 | 4/2007 | Kwak et al. |
| 2007/0099420 A1 | 5/2007 | Dominguez et al. |
| 2007/0190780 A1 | 8/2007 | Chung et al. |
| 2007/0199922 A1 | 8/2007 | Shen et al. |
| 2007/0264105 A1 | 11/2007 | Pharand et al. |
| 2008/0017891 A1 | 1/2008 | Datta et al. |
| 2008/0045010 A1 | 2/2008 | Wongsenakhum et al. |
| 2008/0081127 A1 | 4/2008 | Thompson et al. |
| 2008/0081452 A1 | 4/2008 | Kim et al. |
| 2008/0081453 A1 | 4/2008 | Kim et al. |
| 2008/0081470 A1 | 4/2008 | Clark |
| 2008/0124926 A1 | 5/2008 | Chan et al. |
| 2008/0248649 A1 | 10/2008 | Adetutu et al. |
| 2008/0254619 A1 | 10/2008 | Lin et al. |
| 2008/0254623 A1 | 10/2008 | Chan et al. |
| 2008/0268642 A1 | 10/2008 | Yanagita et al. |
| 2008/0280438 A1 | 11/2008 | Lai et al. |
| 2008/0283844 A1 | 11/2008 | Hoshi et al. |
| 2008/0317954 A1 | 12/2008 | Lu et al. |
| 2008/0317972 A1 | 12/2008 | Hendriks et al. |
| 2009/0045517 A1 | 2/2009 | Sugiura et al. |
| 2009/0050937 A1 | 2/2009 | Murata et al. |
| 2009/0053893 A1 | 2/2009 | Khandelwal et al. |
| 2009/0137117 A1 | 5/2009 | Park et al. |
| 2009/0142509 A1 | 6/2009 | Yamamoto |
| 2009/0149022 A1 | 6/2009 | Chan et al. |
| 2009/0156004 A1 | 6/2009 | Kori et al. |
| 2009/0160030 A1 | 6/2009 | Tuttle |
| 2009/0163025 A1 | 6/2009 | Humayun et al. |
| 2009/0315154 A1 | 12/2009 | Kirby et al. |
| 2009/0321943 A1 | 12/2009 | Meldrim et al. |
| 2010/0007797 A1 | 1/2010 | Stojancic |
| 2010/0035427 A1 | 2/2010 | Chan et al. |
| 2010/0055904 A1 | 3/2010 | Chen et al. |
| 2010/0062149 A1 | 3/2010 | Ma et al. |
| 2010/0072623 A1 | 3/2010 | Prindle et al. |
| 2010/0120245 A1 | 5/2010 | Tjandra et al. |
| 2010/0130002 A1 | 5/2010 | Dao et al. |
| 2010/0130003 A1 | 5/2010 | Lin et al. |
| 2010/0144140 A1 | 6/2010 | Chandrashekar et al. |
| 2010/0155846 A1 | 6/2010 | Mukherjee et al. |
| 2010/0159694 A1 | 6/2010 | Chandrashekar et al. |
| 2010/0167527 A1 | 7/2010 | Wu et al. |
| 2010/0171220 A1 | 7/2010 | Huang |
| 2010/0244141 A1 | 9/2010 | Beyer et al. |
| 2010/0244260 A1 | 9/2010 | Hinomura |
| 2010/0267230 A1 | 10/2010 | Chandrashekar et al. |
| 2010/0267235 A1 | 10/2010 | Chen et al. |
| 2010/0273327 A1 | 10/2010 | Chan et al. |
| 2010/0330800 A1 | 12/2010 | Ivanov et al. |
| 2011/0020546 A1 | 1/2011 | Hamalainen et al. |
| 2011/0059608 A1 | 3/2011 | Gao et al. |
| 2011/0156154 A1 | 6/2011 | Hoentschel et al. |
| 2011/0221044 A1 | 9/2011 | Danek et al. |
| 2011/0223763 A1 | 9/2011 | Chan et al. |
| 2011/0233778 A1 | 9/2011 | Lee et al. |
| 2011/0236594 A1 | 9/2011 | Haverkamp et al. |
| 2011/0281438 A1 | 11/2011 | Lee et al. |
| 2012/0009785 A1 | 1/2012 | Chandrashekar et al. |
| 2012/0015518 A1 | 1/2012 | Chandrashekar et al. |
| 2012/0040530 A1 | 2/2012 | Humayun et al. |
| 2012/0077342 A1 | 3/2012 | Gao et al. |
| 2012/0164832 A1 | 6/2012 | Chandrashekar et al. |
| 2012/0199887 A1 | 8/2012 | Chan et al. |
| 2012/0225192 A1 | 9/2012 | Yudovsky et al. |
| 2012/0231626 A1 | 9/2012 | Lee et al. |
| 2012/0244699 A1 | 9/2012 | Khandelwal et al. |
| 2012/0294874 A1 | 11/2012 | Macary et al. |
| 2013/0043554 A1 | 2/2013 | Piper |
| 2013/0062677 A1 | 3/2013 | Li et al. |
| 2013/0109172 A1 | 5/2013 | Collins et al. |
| 2013/0168864 A1 | 7/2013 | Lee et al. |
| 2013/0285195 A1 | 10/2013 | Piper |
| 2013/0302980 A1 | 11/2013 | Chandrashekar et al. |
| 2014/0011358 A1 | 1/2014 | Chen et al. |
| 2014/0027664 A1 | 1/2014 | Lei et al. |
| 2014/0030889 A1 | 1/2014 | Chen et al. |
| 2014/0061784 A1 | 3/2014 | Kang |
| 2014/0061931 A1 | 3/2014 | Kang |
| 2014/0073135 A1 | 3/2014 | Guan et al. |
| 2014/0154883 A1 | 6/2014 | Humayun et al. |
| 2014/0162451 A1 | 6/2014 | Chen et al. |
| 2014/0209026 A1 | 7/2014 | LaVoie et al. |
| 2014/0308812 A1 | 10/2014 | Arghavani et al. |
| 2014/0319614 A1 | 10/2014 | Paul et al. |
| 2015/0037972 A1 | 2/2015 | Danek et al. |
| 2015/0056803 A1 | 2/2015 | Chandrashekar et al. |
| 2015/0179461 A1 | 6/2015 | Bamnolker et al. |
| 2015/0240359 A1 | 8/2015 | Jdira et al. |

(56) References Cited

U.S. PATENT DOCUMENTS

| | | | |
|---|---|---|---|
| 2015/0279732 A1 | 10/2015 | Lee et al. |
| 2015/0325475 A1 | 11/2015 | Bamnolker et al. |
| 2016/0118345 A1 | 4/2016 | Chen et al. |
| 2016/0190008 A1 | 6/2016 | Chandrashekar et al. |
| 2016/0233220 A1 | 8/2016 | Danek et al. |
| 2016/0293467 A1 | 10/2016 | Caveney et al. |
| 2016/0336222 A1 | 11/2016 | Knapp et al. |
| 2016/0351401 A1 | 12/2016 | Ba et al. |
| 2016/0351402 A1 | 12/2016 | Suzuki et al. |
| 2016/0351444 A1 | 12/2016 | Schloss et al. |
| 2017/0040214 A1 | 2/2017 | Lai et al. |
| 2017/0069527 A1 | 3/2017 | Haukka et al. |
| 2017/0117155 A1 | 4/2017 | Bamnolker et al. |
| 2017/0133231 A1 | 5/2017 | Bamnolker et al. |
| 2017/0306479 A1 | 10/2017 | Raisanen et al. |
| 2017/0306490 A1 | 10/2017 | Chan et al. |
| 2017/0365513 A1 | 12/2017 | Yang et al. |
| 2018/0053660 A1 | 2/2018 | Jandl et al. |
| 2018/0076042 A1 | 3/2018 | Cheng et al. |
| 2018/0240675 A1 | 8/2018 | Bamnolker et al. |
| 2018/0247832 A1 | 8/2018 | Fischer et al. |
| 2018/0286746 A1 | 10/2018 | Na et al. |
| 2018/0330951 A1* | 11/2018 | Kulshreshtha ...... H01L 21/2257 |
| 2019/0019725 A1* | 1/2019 | Chandrashekar .......................... H01L 21/28562 |
| 2019/0326168 A1 | 10/2019 | Yang et al. |
| 2021/0238736 A1 | 8/2021 | Butail et al. |
| 2021/0335617 A1 | 10/2021 | Deng et al. |
| 2021/0348271 A1 | 11/2021 | Mishra et al. |
| 2022/0037163 A1 | 2/2022 | Yang et al. |
| 2022/0181158 A1 | 6/2022 | Bowes et al. |
| 2022/0364232 A1 | 11/2022 | Nannapaneni et al. |
| 2023/0130557 A1 | 4/2023 | Birru et al. |
| 2023/0290639 A1 | 9/2023 | Schloss et al. |
| 2024/0006180 A1 | 1/2024 | Pan et al. |
| 2024/0266177 A1 | 8/2024 | Deng et al. |

FOREIGN PATENT DOCUMENTS

| | | |
|---|---|---|
| CN | 101213320 A | 7/2008 |
| CN | 101308794 A | 11/2008 |
| CN | 101447427 A | 6/2009 |
| CN | 101540294 A | 9/2009 |
| CN | 101572291 A | 11/2009 |
| CN | 101770978 A | 7/2010 |
| CN | 101789369 A | 7/2010 |
| CN | 101952945 A | 1/2011 |
| CN | 101970352 A | 2/2011 |
| CN | 102084462 A | 6/2011 |
| CN | 102867953 A | 1/2013 |
| CN | 103125013 A | 5/2013 |
| CN | 103132046 A | 6/2013 |
| CN | 103579184 A | 2/2014 |
| CN | 105097446 A | 11/2015 |
| CN | 107305838 A | 10/2017 |
| CN | 107743653 A | 2/2018 |
| CN | 107768304 A | 3/2018 |
| CN | 104752339 B | 6/2019 |
| CN | 111357083 A | 6/2020 |
| CN | 110004429 B | 8/2021 |
| EP | 0437110 A2 | 7/1991 |
| EP | 1156132 A2 | 11/2001 |
| EP | 1179838 A2 | 2/2002 |
| JP | S5629648 A | 3/1981 |
| JP | S63274772 A | 11/1988 |
| JP | H0266399 A | 3/1990 |
| JP | H02187031 A | 7/1990 |
| JP | H04142061 A | 5/1992 |
| JP | H04216630 A | 8/1992 |
| JP | H05226280 A | 9/1993 |
| JP | H07147321 A | 6/1995 |
| JP | H07226393 A | 8/1995 |
| JP | H08115984 A | 5/1996 |
| JP | H08325735 A | 12/1996 |
| JP | H0922896 A | 1/1997 |
| JP | H0927596 A | 1/1997 |
| JP | H10144688 A | 5/1998 |
| JP | H10163132 A | 6/1998 |
| JP | 2966406 B2 | 10/1999 |
| JP | H11330006 A | 11/1999 |
| JP | 2000208516 A | 7/2000 |
| JP | 2000235962 A | 8/2000 |
| JP | 2001525889 A | 12/2001 |
| JP | 2002016066 A | 1/2002 |
| JP | 2002124488 A | 4/2002 |
| JP | 2003193233 A | 7/2003 |
| JP | 2004235456 A | 8/2004 |
| JP | 2004273764 A | 9/2004 |
| JP | 2004536960 A | 12/2004 |
| JP | 2005029821 A | 2/2005 |
| JP | 2005518088 A | 6/2005 |
| JP | 2007009298 A | 1/2007 |
| JP | 2007027627 A | 2/2007 |
| JP | 2007027680 A | 2/2007 |
| JP | 2007507892 A | 3/2007 |
| JP | 2007520052 A | 7/2007 |
| JP | 2007250907 A | 9/2007 |
| JP | 2007251164 A | 9/2007 |
| JP | 2008016803 A | 1/2008 |
| JP | 2008060603 A | 3/2008 |
| JP | 2008091844 A | 4/2008 |
| JP | 2008283220 A | 11/2008 |
| JP | 2008303466 A | 12/2008 |
| JP | 2009024252 A | 2/2009 |
| JP | 2009144242 A | 7/2009 |
| JP | 2009533877 A | 9/2009 |
| JP | 2009253008 A | 10/2009 |
| JP | 2009540123 A | 11/2009 |
| JP | 2010251760 A | 11/2010 |
| JP | 2011035366 A | 2/2011 |
| JP | 2011192680 A | 9/2011 |
| JP | 2013080891 A | 5/2013 |
| JP | 2014049747 A | 3/2014 |
| JP | 2015067869 A | 4/2015 |
| JP | 2015514160 A | 5/2015 |
| JP | 2015221940 A | 12/2015 |
| JP | 2017008412 A | 1/2017 |
| JP | 2017014615 A | 1/2017 |
| JP | 2017053024 A | 3/2017 |
| KR | 100196018 B1 | 6/1999 |
| KR | 100272523 B1 | 12/2000 |
| KR | 20010048302 A | 6/2001 |
| KR | 20010093766 A | 10/2001 |
| KR | 20020040877 A | 5/2002 |
| KR | 20020049730 A | 6/2002 |
| KR | 20030050652 A | 6/2003 |
| KR | 20040085153 A | 10/2004 |
| KR | 20050022261 A | 3/2005 |
| KR | 20050054122 A | 6/2005 |
| KR | 20050068555 A | 7/2005 |
| KR | 20050087428 A | 8/2005 |
| KR | 20060087844 A | 8/2006 |
| KR | 100705936 B1 | 4/2007 |
| KR | 20080001460 A | 1/2008 |
| KR | 20080015129 A | 2/2008 |
| KR | 20080036679 A | 4/2008 |
| KR | 20080060012 A | 7/2008 |
| KR | 20080061978 A | 7/2008 |
| KR | 20080101745 A | 11/2008 |
| KR | 20080110897 A | 12/2008 |
| KR | 20090068187 A | 6/2009 |
| KR | 20090074560 A | 7/2009 |
| KR | 20090095546 A | 9/2009 |
| KR | 20090103815 A | 10/2009 |
| KR | 20100014714 A | 2/2010 |
| KR | 20100029952 A | 3/2010 |
| KR | 20100068845 A | 6/2010 |
| KR | 20100114856 A | 10/2010 |
| KR | 20110027607 A | 3/2011 |
| KR | 20110056494 A | 5/2011 |
| KR | 20110084166 A | 7/2011 |
| KR | 20110105645 A | 9/2011 |
| KR | 20110108382 A | 10/2011 |

(56) References Cited

FOREIGN PATENT DOCUMENTS

| KR | 20120005992 A | 1/2012 |
|---|---|---|
| KR | 20130119519 A | 10/2013 |
| KR | 20140028992 A | 3/2014 |
| KR | 20140141686 A | 12/2014 |
| KR | 101495372 B1 | 2/2015 |
| KR | 20150128615 A | 11/2015 |
| KR | 20160039139 A | 4/2016 |
| KR | 20160140448 A | 12/2016 |
| KR | 20160140458 A | 12/2016 |
| KR | 20170120443 A | 10/2017 |
| KR | 20180019487 A | 2/2018 |
| KR | 20180101745 A | 9/2018 |
| KR | 102255768 B1 | 5/2021 |
| TW | 310461 B | 7/1997 |
| TW | 434708 B | 5/2001 |
| TW | 452607 B | 9/2001 |
| TW | 567544 B | 12/2003 |
| TW | 589684 B | 6/2004 |
| TW | 200421465 A | 10/2004 |
| TW | 200626748 A | 8/2006 |
| TW | 200710968 A | 3/2007 |
| TW | 201405781 A | 2/2014 |
| TW | 201409697 A | 3/2014 |
| TW | 201519317 A | 5/2015 |
| TW | 201626503 A | 7/2016 |
| TW | 201715067 A | 5/2017 |
| WO | WO-9851838 A1 | 11/1998 |
| WO | WO-0127347 A1 | 4/2001 |
| WO | WO-0129893 A1 | 4/2001 |
| WO | WO-0241379 A1 | 5/2002 |
| WO | WO-02101114 A1 | 12/2002 |
| WO | WO-03029515 A2 | 4/2003 |
| WO | WO-2005027211 A1 | 3/2005 |
| WO | WO-2005034223 A1 | 4/2005 |
| WO | WO-2007121249 A2 | 10/2007 |
| WO | WO-2007146537 A2 | 12/2007 |
| WO | WO-2010025357 A2 | 3/2010 |
| WO | WO-2011119293 A2 | 9/2011 |
| WO | WO-2013148444 A1 | 10/2013 |
| WO | WO-2013148880 A1 | 10/2013 |
| WO | WO-2014058536 A1 | 4/2014 |
| WO | WO-2017123967 A1 | 7/2017 |
| WO | WO-2019036292 A1 | 2/2019 |
| WO | WO-2019055317 A1 | 3/2019 |
| WO | WO-2019099997 A1 | 5/2019 |
| WO | WO-2020185618 A1 | 9/2020 |
| WO | WO-2021046058 A1 | 3/2021 |
| WO | WO-2021178399 A1 | 9/2021 |

OTHER PUBLICATIONS

Anonymous, "Lam Research enables next-generation memory with industry's first ALD process for low-fluorine tungsten fill" Semiconductor Digest News and Industry Trends for Solid State Technology, Aug. 2016, 2 Pages.
Becker, J., et al., "Diffusion Barrier Properties of Tungsten Nitride Films Grown by Atomic Layer Deposition From bis(tert-butylimido) bis(dimethylamido)tungsten and ammonia," Applied Physics Letters, 2003, vol. 82 (14), pp. 2239-2241.
Bell et al. (Jan. 1996) "Batch Reactor Kinetic Studies of Tungsten LPCVD from Silane and Tungsten Hexafluoride", J. Electrochem. Soc., 143(1):296-302.
Chinese Fifth Office Action dated May 5, 2015 issued in Application No. CN 200980133560.1.
Chinese First Office Action dated Jun. 2, 2017 issued in Application No. CN 201410856793.7.
Chinese First Office Action dated Sep. 18, 2012 issued in Application No. CN 200980133560.1.
Chinese First Office Action dated Sep. 6, 2015 issued in Application No. CN 201310320848.8.
Chinese Fourth Office Action dated Jan. 5, 2015 issued in Application No. CN 200980133560.1.
Chinese Second Office Action dated Aug. 7, 2013 issued in Application No. CN 200980133560.1.
Chinese Second Office Action dated Feb. 5, 2018 issued in Application No. CN 201410856793.7.
Chinese Second Office Action dated May 16, 2016 issued in Application No. CN 201310320848.8.
Chinese Third Office Action dated Apr. 22, 2014 issued in Application No. CN 200980133560.1.
Chinese Third Office Action dated Oct. 8, 2018 issued in Application No. CN 201410856793.7.
CN Office Action dated Aug. 24, 2018 in Application No. CN 201380022693.8 with English Translation.
CN Office Action dated Feb. 14, 2023 in Application No. CN202080037670.4 with English translation.
CN Office Action dated Jan. 23, 2017 in Application No. CN 201380022693.8 with English Translation.
CN office action dated Jul. 26, 2023, in application No. CN202080037670.4 with English Translation.
CN Office Action dated Jun. 27, 2023, in Application No. CN201910418672.7 with English translation.
CN Office Action dated Mar. 10, 2023, in Application No. CN201880059689.1 with English translation.
CN Office Action dated Mar. 15, 2018 in Application No. CN 201380022693.8 with English Translation.
CN Office Action dated Mar. 18, 2016 in Application No. CN 201380022693.8 with English Translation.
CN Office Action dated Mar. 30, 2023, in Application No. CN202080027971.9 with English translation.
CN Office Action dated Nov. 17, 2023 in CN Application No. 202080057266.3, with English Translation.
CN Office Action dated Oct. 7, 2023, in Application No. CN201880059689.1 with English translation.
CN Office Action dated Oct. 11, 2022, in Application No. CN201910418672.7 with English translation.
CN Office Action dated Oct. 11, 2023, in application No. CN202110914064.2 with English translation.
CN Office Action dated Oct. 27, 2020 in Application No. CN 201811491805.5 with English Translation.
CN Office Action dated Sep. 25, 2017 in Application No. CN 201380022693.8 with English Translation.
Collins et al. (Jan. 21, 2003) "Pulsed Deposition of Ultra Thin Tungsten for Plugfill of High Aspect Ratio Contacts," Presentation made at Semicon Korea, 9 pages.
Coventor Brochure "3D NAND: Challenges Beyond 96-Layer Memory Arrays", Oct. 12, 2018, pp. 1-4.
Diawara, Y. et al. (1993) "Rapid thermal annealing for reducing stress in tungsten x-ray mask absorber," http://dx.doi.org/10.1116/1.586673, Journal of Vacuum Science & Technology B 11:296-300 (per table of contents of journal).
Dominique, S. et al., "An alternative to Tungsten in 3D-NAND technology", IEEE International Interconnect Technology Conference (IITC), 2021, pp. 1-3.
Elam et al. (2001) "Nucleation and Growth During Tungsten Atomic Layer Deposition on SiO2 Surfaces," Thin Solid Films, 13pp.
Fair, James A. (1983) Presentation by Inventor "Chemical Vapor Deposition of Refractory Metal Silicides," Genus Incorporated, 27 pp.
George et al. (1996) "Surface Chemistry for atomic Layer Growth", J. Phys. Chem, 100(31):13121-13131.
Gonohe, Narishi (2002) "Tungsten Nitride Deposition by Thermal Chemical Vapor Deposition as Barrier Metal for Cu Interconnection," [ http://www.jim.co.jp/journal/e/pdf3/43/07/1585.pdf.], Materials Transactions, 43(7): 1585-1592.
Habuka, Hitoshi (2010) "Advance of Atomic Layer Deposition in Semiconductor Materials Manufacturing Process: Cleaning Technology for Thin Film Formation Reactor" Department of Chemical and Energy Engineering, Yokohama National University, 79, 5 Tokiwadai Hodogaya- ku Kanagawa 240, 8501, Japan.
Hoover, Cynthia (Jul. 2007) "Enabling Materials for Contact Metallization," Praxair Electronic Materials R&D, pp. 1-16.
International Preliminary Report on Patentability and Written Opinion dated Oct. 9, 2014, in Application No. 2013/034167.

(56) References Cited

OTHER PUBLICATIONS

International Preliminary Report on Patentability and written opinion dated Sep. 15, 2022, in PCT Application No. PCT/US2021/020748.
International Preliminary Report on Patentability dated Dec. 2, 2021, issued in PCT/US2020/033461.
International Preliminary Report on Patentability dated Feb. 9, 2023 in PCT Application No. PCT/US2020/070325.
International Preliminary Report on Patentability dated Feb. 24, 2022 in PCT Application No. PCT/US2020/070394.
International Preliminary Report on Patentability dated Jun. 24, 2021 issued in Application No. PCT/US2019/066301.
International Preliminary Report on Patentability dated Nov. 12, 2020 in Application No. PCT/US2019/030712.
International Preliminary Report on Patentability dated Oct. 21, 2021, in application No. PCT/US2020/027107.
International Search Report and Written Opinion dated Apr. 13, 2020 issued in Application No. PCT/US2019/066301.
International Search Report and Written Opinion dated Apr. 27, 2021 in PCT Application No. PCT/US2020/070325.
International Search Report and Written Opinion dated Aug. 16, 2023, in Application No. PCT/US2023/017635.
International Search Report and Written Opinion dated Aug. 19, 2019 in Application No. PCT/US2019/030712.
International Search Report and Written Opinion dated Jul. 24, 2020 issued in Application No. PCT/US2020/027107.
International Search Report and Written Opinion, dated Jul. 26, 2013, in Application No. 2013/034167.
International Search Report and Written Opinion dated Jun. 18, 2021, in PCT Application No. PCT/US2021/020748.
International Search Report and Written Opinion dated Nov. 27, 2020, in PCT Application No. PCT/US2020/070394.
International Search Report and Written Opinion dated Sep. 4, 2020 in PCT Application No. PCT/US2020/033461.
Jamie, W. et al., "In Situ Atomic Layer Deposition and Electron Tunneling Characterization of Monolayer $Al_2O_3$ on Fe for Magnetic Tunnel Junctions", AIP Advances, 2018, vol. 8, No. 125218, pp. 1-9.
Japanese First Office Action dated Jun. 24, 2020 issued in Application No. JP 2016-105216.
Japanese First Office Action dated Jun. 3, 2020 issued in Application No. JP 2016-104837.
Japanese Office Action dated Dec. 3, 2013 issued in Application No. JP 2011-525228.
Japanese Office Action dated Feb. 14, 2023 issued in Application No. JP2020-508312 with English translation.
Japanese Office Action dated Jul. 29, 2014 issued in Application No. JP 2010-093544.
Japanese Office Action dated Jun. 17, 2014 issued in Application No. JP 2010-055163.
Japanese Office Action dated Mar. 4, 2014 issued in Application No. JP 2010-093522.
Japanese Office Action dated May 7, 2013, issued in Application No. JP 2008-310322.
Japanese Office Action dated Sep. 3, 2013, issued in Application No. JP 2008-325333.
Japanese Second Office Action dated Apr. 5, 2021 issued in Application No. JP 2016-104837.
Japanese Second Office Action dated Mar. 3, 2021 issued in Application No. JP 2016-105216.
Johnson, R.W., Hultqvist, A., Bent, S.F., "A brief review of atomic layer deposition: from fundamentals to applications", Materials today, (Jun. 1, 2014), 17(5):236-46.
JP Office Action dated Dec. 20, 2016 in Application No. JP 2015-503547 with English Translation.
JP Office Action dated Jul. 19, 2022, in Application No. JP2020-508312 with English translation.
JP Office Action dated Jun. 6, 2023 in Application No. JP2020561743 With English translation.
JP Office Action dated May 31, 2022, in Application No. JP2016-104837 with English translation.
JP Office Action dated Nov. 24, 2021, in Application No. JP20160104837 with English translation.
JP Office Action dated Sep. 5, 2023, in Application No. JP2020-508312 with English translation.
Kim, K. et al., "Simulation of Residual Stress and Its Impact on a Poly-Silicon Channel for Three-Dimensional, Stacked, Vertical-NAND Flash Memories", Journal of the Korean Physical Society, 2017, vol. 70 (12), pp. 1041-1048.
Kim, S. et al., "Effects of $B_2H_6$ Pretreatment on ALD of W Film Using a Sequential Supply of $WF_6$ and $SiH_4$", Electrochemical and Solid-State Letters, The Electrochemical Society, 2005, vol. 8, No. 10, pp. C155-C159.
Klaus et al. (2000) "Atomic layer deposition of tungsten using sequential surface chemistry with a sacrificial stripping reaction," Thin Solid Films 360:145-153.
Klaus et al. (2000) "Atomically Controlled Growth of Tungsten and Tungsten Nitride Using Sequential Surface Reactions," Applied Surface Science, pp. 162-163, 479-491.
Korean Decision for Grant dated Nov. 5, 2021 issued in Application No. KR 10-2014-0192527.
Korean Final Rejection dated Jun. 30, 2021 issued in Application No. KR 10-2014-0192527.
Korean Final Rejection Office Action dated Apr. 27, 2021 issued in Application No. KR 10-2016-0064157.
Korean First Notification of Provisional Rejection, dated Dec. 8, 2010, issued in Application No. KR 2004-0036346.
Korean First Office Action dated Aug. 2, 2021, issued in Application No. KR 10-2014-0184759.
Korean First Office Action dated Aug. 30, 2019 issued in Application No. KR 10-2013-0075854.
Korean First Office Action dated Aug. 6, 2020 issued in Application No. KR 10-2014-0044410.
Korean First Office Action dated Dec. 21, 2020 issued in Application No. KR 10-2014-0192527.
Korean First Office Action dated Jan. 1, 2019 issued in Application No. KR 10-2013-0089130.
Korean First Office Action dated Jul. 10, 2015 issued in Application No. KR 10-2014-0090283.
Korean First Office Action dated Jul. 12, 2021 issued in Application No. KR 10-2021-0063953.
Korean First Office Action dated Nov. 25, 2020 issued in Application No. KR 10-2020-0124056.
Korean First Office Action dated Oct. 1, 2020 issued in Application No. KR 10-2016-0064157.
Korean First Office Action dated Oct. 21, 2019 issued in Application No. KR 10-2013-0108151 with English translation.
Korean First Office Action dated Sep. 24, 2019 issued in Application No. KR 10-2013-0089834.
Korean Notification of Provisional Rejection dated Jul. 17, 2012, issued in Application No. KR 2010-0087997.
Korean Office Action dated Jul. 19, 2013 issued in Application No. KR 2011-7004322.
Korean Office Action dated Jul. 28, 2021 issued in Application No. KR 10-2016-0064157.
Korean Office Action, dated Jun. 13, 2011, issued in Application No. KR 2011-0032098.
Korean Office Action dated Jun. 17, 2014 issued in Application No. KR 10-2013-7027117.
Korean Office Action dated Jun. 21, 2021 issued in Application No. KR 10-2020-0124056.
Korean Office Action dated Jun. 28, 2020 issued in Application No. KR 10-2020-0141428.
Korean Office Action dated Mar. 21, 2013 issued in Application No. KR 10-2010-0024905.
Korean Office Action, dated Mar. 28, 2013, issued in Application No. KR 10-2007-0012027.
Korean Office Action dated Mar. 4, 2013 in Application No. KR 2010-0035449.
Korean Office Action, dated Nov. 24, 2010, issued in Application No. KR 10-2004-0013210.

(56) References Cited

OTHER PUBLICATIONS

Korean Office Action dated Nov. 30, 2020 issued in Application No. KR 10-2020-0141428.
Korean Office Action dated Nov. 4, 2013 issued in Application No. KR 10-2013-7027117.
Korean Office Action dated Sep. 6, 2012 issued in Application No. KR 2011-7004322.
Korean Second Office Action dated Apr. 7, 2020 issued in Application No. KR 10-2013-0075854.
Korean Second Office Action dated Jan. 25, 2014 in Application No. KR 10-2010-0035453.
Korean Second Office Action dated Mar. 11, 2020 issued in Application No. KR 10-2013-0108151.
Korean Third Office Action dated Jun. 25, 2020 issued in Application No. KR 10-2013-0108151.
Korean Third Office Action dated Jun. 29, 2020 issued in Application No. KR 10-2013-0075854.
KR Office Action dated Dec. 14, 2021, in application No. 20210063953 with English translation.
KR Decision for Grant dated Apr. 7, 2020 in Application No. KR 10-2020-7000199 with English Translation.
KR Final Office Action dated Oct. 31, 2023 in KR Application No. KR10-2016-0064757, with English Translation.
KR Final Rejection dated Oct. 5, 2021, in application No. KR1020200141428 with English translation.
KR Office Action dated Apr. 19, 2022, in application No. KR20140184759 with English Translation.
KR Office Action dated Apr. 18, 2019 in Application No. KR 10-2014-7030125 with English Translation.
KR Office Action dated Aug. 22, 2023, in Application No. KR 10-2022-0088685 with English translation.
KR Office Action dated Dec. 1, 2022, in Application No. KR10-2022-0088685 with English translation.
KR Office Action dated Dec. 6, 2022, in Application No. KR10-2022-0106634 with English translation.
KR Office Action dated Feb. 11, 2023 in Application No. KR10-2016-0064757 with English translation.
KR Office Action dated Feb. 16, 2022, in Application No. KR1020160064157 with English translation.
KR Office Action dated Jan. 11, 2022, in KR Application No. 10-2022-0000825 with English translation.
KR Office Action dated Jul. 31, 2023, in Application No. KR10-2020-7007526 with English translation.
KR Office Action dated Jun. 23, 2022, in Application No. KR10-2022-0015236 with English translation.
KR Office action dated May 25, 2022, in Application No. KR20210063953 with English Translation.
Lai, Ken et al. (Jul. 17, 2000) "Tungsten chemical vapor deposition using tungsten hexacarbonyl: microstructure of as-deposited and annealed films," [ http://dx.doi.org/10.1016/S0040-6090(00)00943-3], Thin Solid Films, 370:114-121.
Lai, Ken K. and Lamb, H. Henry (1995) "Precursors for Organometallic Chemical Vapor Deposition of Tungsten Carbide Films," Chemistry Material, 7(12):2284-2292.
Lee, B. et al., "ALD Tungsten Solves Capacity Challenges in 3D NAND Device Manufacturing", Lam Brochure, Jan. 2019, pp. 1-4.
Lee et al. (Jan. 21, 2003) "Pulsed Deposition of Ultra Thin Tungsten and its Application for Plugfill of High Aspect Ratio Contacts," Abstract, 1 page.
Li et al. (2002) "Deposition of WNxCy-Thin Films by ALCVDTM Method for Diffusion Barriers in Metallization," IITC Conference Report, 3 pp.
Li, Z. et al., "Atomic Layer Deposition of Ultrathin Copper Metal Films from a Liquid Copper(I) Amidinate Precursor", Journal of The Electrochemical Society, 2006, vol. 153, No. 11, pp. C787-C794.
Lim, B. et al., "Atomic Layer Deposition of Transition Metals", Nature Materials, 2003, vol. 2, pp. 749-754.

Manik. P, et al. (2012) "Fermi-level unpinning and low resistivity in contacts to n-type Ge with a thin ZnO interfacial layer," App. Phys. Lett. 101:182105-5.
Mingxia L., et al., "Template-induced W Formation and Size Effect of Residual Stress and Resistivity in W Films," Wanfang Data Knowledge Service Platform, 2007, pp. 328-334.
Notice of Allowance dated Dec. 3, 2012, issued in U.S. Appl. No. 13/095,734.
PCT International Preliminary Report on Patentability and Written Opinion, dated Mar. 10, 2011, issued in PCT/US2009/055349.
PCT International Search Report and Written Opinion, dated Apr. 12, 2010, issued in PCT/US2009/055349.
PCT Search Report and Written Opinion, dated Jan. 19, 2005, issued in PCT/US2004/006940.
Saito et al. (2001) "A Novel Copper Interconnection Technology Using Self Aligned Metal Capping Method," IEEE, 3pp.
SG Office Action dated Jul. 24, 2023, in application No. SG11202111277U.
SG Written Opinion dated Sep. 1, 2023 in Application No. SG11202201293W.
Shioya, Yoshimi et al. (Dec. 1, 1985) "Analysis of stress in chemical vapor deposition tungsten silicide film," [Retrieved online Dec. 18, 2013 at http://dx.doi.org/10.1063/1.335552], Journal of Applied Physics, 58(11):4194-4199.
Taiwan Examination Report dated Dec. 26, 2016 issued in Application No. TW 102123248.
Taiwan Examination Report, dated Jun. 22, 2017, issued in Application No. TW 103113287.
Taiwan Examination Report dated Mar. 16, 2017 issued in Application No. TW 102132433.
Taiwan Examination Report dated Oct. 26, 2016 issued in Application No. TW 102126696.
Taiwan Examination Report dated Oct. 26, 2016 issued in Application No. TW 102126976.
Taiwan First Office Action dated Jun. 27, 2018 issued in Application No. TW 103145125.
Taiwan First Office Action [Reissued] dated Jun. 20, 2018, issued in Application No. TW 103144260.
Taiwan Office Action and Search Report dated Feb. 12, 2015 issued in Application No. TW 099130354.
Taiwan Office Action dated Aug. 4, 2015 issued in Application No. TW 099111859.
Taiwan Office Action dated Dec. 27, 2014 issued in Application No. TW 099111860.
Taiwan Office Action dated Jan. 10, 2017 issued in Application No. TW 105105984.
Taiwan Office Action dated Jun. 8, 2015 issued in Application No. TW 099107504.
Taiwan Office Action (Rejection Decision) dated Oct. 28, 2015 issued in Application No. TW 099130354.
Taiwan Search Report dated Nov. 30, 2016 issued in Application No. TW 099130354.
Taiwanese First Office Action dated Nov. 13, 2019 issued in Application No. TW 105116371.
Taiwanese First Office Action dated Nov. 25, 2019 issued in Application No. TW 105116363.
Taiwanese Second Office Action dated Aug. 19, 2020 issued in Application No. TW 105116371.
Taiwanese Third Office Action dated Mar. 16, 2021 issued in Application No. TW 105116371.
TW Office Action dated Feb. 21, 2022, in Application No. TW107128141 with English translation.
TW Office Action dated May 23, 2023 in Application No. TW111140395 with English Translation.
TW Office Action dated Oct. 25, 2016 in Application No. TW 102110947 with English Translation.
U.S. Corrected Notice of Allowance dated May 5, 2022 in U.S. Appl. No. 16/638,430.
U.S. Final Office Action dated Apr. 14, 2017, in U.S. Appl. No. 14/965,806.
US Final Office Action, dated Apr. 28, 2009, issued in U.S. Appl. No. 11/782,570.

(56) References Cited

OTHER PUBLICATIONS

US Final Office Action, dated Apr. 30, 2012, issued in U.S. Appl. No. 12/755,248.
US Final Office Action, dated Dec. 28, 2005, issued in U.S. Appl. No. 10/815,560.
US Final Office Action, dated Dec. 30, 2010, issued in U.S. Appl. No. 11/963,698.
US Final Office Action, dated Dec. 9, 2009, issued in U.S. Appl. No. 11/963,698.
US Final Office Action, dated Feb. 14, 2014, issued in U.S. Appl. No. 13/560,688.
US Final Office Action, dated Feb. 25, 2009, issued in U.S. Appl. No. 11/349,035.
US Final Office Action, dated Feb. 26, 2009, issued in U.S. Appl. No. 11/265,531.
US Final Office Action, dated Feb. 7, 2011, issued in U.S. Appl. No. 12/202,126.
US Final Office Action, dated Jan. 13, 2010, issued in U.S. Appl. No. 12/030,645.
US Final Office Action, dated Jan. 14, 2016, issued in U.S. Appl. No. 13/949,092.
US Final Office Action, dated Jan. 20, 2017, issued in U.S. Appl. No. 14/723,275.
US Final Office Action, dated Jan. 26, 2010 from U.S. Appl. No. 11/951,236.
US Final Office Action, dated Jul. 14, 2005, issued in U.S. Appl. No. 10/649,351.
U.S. Final Office Action dated Jul. 17, 2015 in U.S. Appl. No. 14/502,817.
US Final Office Action, dated Jul. 2, 2014, issued in U.S. Appl. No. 13/020,748.
US Final Office Action, dated Jul. 23, 2010, issued in U.S. Appl. No. 12/030,645.
US Final Office Action, dated Jul. 25, 2016, issued in U.S. Appl. No. 14/738,685.
US Final Office Action, dated Jun. 15, 2011, issued in U.S. Appl. No. 12/636,616.
US Final Office Action, dated Jun. 2, 2015, issued in U.S. Appl. No. 14/097,160.
US Final Office Action dated Mar. 21, 2019, issued in U.S. Appl. No. 15/415,800.
US Final Office Action, dated May 17, 2006, issued in U.S. Appl. No. 10/984,126.
US Final Office Action, dated May 18, 2017, issued in U.S. Appl. No. 13/949,092.
US Final Office Action, dated May 31, 2016, issued in U.S. Appl. No. 14/135,375.
US Final Office Action, dated May 7, 2010, issued in U.S. Appl. No. 12/202,126.
US Final Office Action, dated Nov. 16, 2012, issued in U.S. Appl. No. 13/020,748.
US Final Office Action, dated Nov. 17, 2011, issued in U.S. Appl. No. 12/829,119.
US Final Office Action, dated Nov. 20, 2009, issued in U.S. Appl. No. 11/349,035.
US Final Office Action, dated Nov. 26, 2013, issued in U.S. Appl. No. 13/633,798.
US Final Office Action, dated Nov. 5, 2014, issued in U.S. Appl. No. 13/633,502.
US Final Office Action, dated Oct. 16, 2014, issued in U.S. Appl. No. 13/862,048.
US Final Office Action, dated Oct. 19, 2010, issued in U.S. Appl. No. 12/407,541.
US Final Office Action, dated Sep. 12, 2012, issued in U.S. Appl. No. 12/755,259.
U.S. Final Office Action dated Sep. 25, 2023, in U.S. Appl. No. 17/312,594.
US Final Office Action, dated Sep. 29, 2015, issued in U.S. Appl. No. 14/135,375.
U.S. Non Final Office Action dated Mar. 16, 2023 in U.S. Appl. No. 17/312,594.
U.S. Non-Final Office Action dated Dec. 15, 2021 in U.S. Appl. No. 17/250,014.
U.S. Non-Final Office Action dated Dec. 18, 2014 in U.S. Appl. No. 14/502,817.
U.S. Non-Final Office Action dated Dec. 23, 2014 in U.S. Appl. No. 13/851,885.
U.S. Non-Final Office Action dated Jul. 7, 2023, in U.S. Appl. No. 17/633,562.
U.S. Non-Final Office Action dated Sep. 11, 2017 in U.S. Appl. No. 14/965,806.
U.S. Non-Final Office Action dated Sep. 14, 2023, in U.S. Appl. No. 17/601,918.
U.S. Non-Final Office Action dated Sep. 2, 2016 in U.S. Appl. No. 14/965,806.
U.S. Non-Final Office Action dated Sep. 21, 2021, in U.S. Appl. No. 16/638,430.
US Notice of Allowance and Fee Due, dated Jan. 24, 2011, issued in U.S. Appl. No. 12/030,645.
US Notice of Allowance,, dated Apr. 24, 2007, issued in U.S. Appl. No. 10/815,560.
US Notice of Allowance, dated Apr. 28, 2015, issued in U.S. Appl. No. 13/862,048.
US Notice of Allowance, dated Apr. 6, 2010, issued in U.S. Appl. No. 11/951,236.
US Notice of Allowance, dated Aug. 25, 2006, issued in U.S. Appl. No. 10/984,126.
U.S. Notice of Allowance dated Aug. 3, 2016 in U.S. Appl. No. 13/851,885.
US Notice of Allowance, dated Aug. 7, 2012, issued in U.S. Appl. No. 12/829,119.
U.S. Notice of Allowance dated Dec. 14, 2016 in U.S. Appl. No. 13/851,885.
US Notice of Allowance dated Dec. 24, 2013, issued in U.S. Appl. No. 12/723,532.
US Notice of Allowance, dated Jan. 12, 2018, issued in U.S. Appl. No. 13/949,092.
US Notice of Allowance, dated Jan. 19, 2005, issued in U.S. Appl. No. 10/435,010.
US Notice of Allowance, dated Jan. 19, 2018, issued in U.S. Appl. No. 15/398,462.
US Notice of Allowance, dated Jan. 20, 2017, issued in U.S. Appl. No. 14/989,444.
US Notice of Allowance, dated Jan. 22, 2015, issued in U.S. Appl. No. 13/928,216.
U.S. Notice of Allowance dated Jan. 25, 2022, in U.S. Appl. No. 16/638,430.
US Notice of Allowance, dated Jul. 10, 2013, issued in U.S. Appl. No. 12/755,259.
US Notice of Allowance, dated Jul. 21, 2006, issued in U.S. Appl. No. 10/649,351.
US Notice of Allowance, dated Jul. 25, 2011, issued in U.S. Appl. No. 12/363,330.
U.S. Notice of Allowance dated Jun. 7, 2022 in U.S. Appl. No. 17/250,014.
US Notice of Allowance, dated Jun. 17, 2015, issued in U.S. Appl. No. 13/862,048.
US Notice of Allowance, dated Jun. 2, 2015, issued in U.S. Appl. No. 14/173,733.
US Notice of Allowance, dated Jun. 30, 2011, issued in U.S. Appl. No. 12/538,770.
US Notice of Allowance, dated Jun. 7, 2013, issued in U.S. Appl. No. 12/202,126.
US Notice of Allowance, dated Mar. 12, 2003, issued in U.S. Appl. No. 09/975,074.
US Notice of Allowance, dated Mar. 2, 2010, issued in U.S. Appl. No. 11/349,035.
US Notice of Allowance, dated Mar. 2, 2012, issued in U.S. Appl. No. 12/556,490.
US Notice of Allowance, dated Mar. 2, 2015, issued in U.S. Appl. No. 13/633,502.

(56) References Cited

OTHER PUBLICATIONS

U.S. Notice of Allowance dated Mar. 24, 2017 in U.S. Appl. No. 13/851,885.
US Notice of Allowance, dated May 23, 2014, issued in U.S. Appl. No. 13/633,798.
US Notice of Allowance, dated May 4, 2009, issued in U.S. Appl. No. 11/265,531.
US Notice of Allowance, dated May 4, 2017, issued in U.S. Appl. No. 14/723,275.
US Notice of Allowance, dated Nov. 17, 2009, issued in U.S. Appl. No. 11/305,368.
US Notice of Allowance, dated Nov. 18, 2016, issued in U.S. Appl. No. 14/723,270.
US Notice of Allowance dated Nov. 29, 2012, issued in U.S. Appl. No. 13/244,016.
US Notice of Allowance, dated Nov. 4, 2014, issued in U.S. Appl. No. 13/560,688.
US Notice of Allowance, dated Oct. 13, 2016, issued in U.S. Appl. No. 14/738,685.
US Notice of Allowance, dated Oct. 25, 2016, issued in U.S. Appl. No. 14/135,375.
US Notice of Allowance, dated Oct. 4, 2012, issued in U.S. Appl. No. 13/276,170.
US Notice of Allowance, dated Oct. 7, 2004, issued in U.S. Appl. No. 10/435,010.
US Notice of Allowance, dated Sep. 14, 2005, issued in U.S. Appl. No. 10/690,492.
U.S. Notice of Allowance dated Sep. 16, 2022 in U.S. Appl. No. 17/250,014.
US Notice of Allowance, dated Sep. 17, 2009, issued in U.S. Appl. No. 11/782,570.
US Notice of Allowance, dated Sep. 19, 2011, issued in U.S. Appl. No. 12/407,541.
US Notice of Allowance, dated Sep. 2, 2011, issued in U.S. Appl. No. 11/963,698.
U.S. Notice of Allowance dated Sep. 25, 2015 in U.S. Appl. No. 14/502,817.
US Notice of Allowance, dated Sep. 30, 2011, issued in U.S. Appl. No. 12/636,616.
US Notice of Allowance dated Sep. 4, 2013 issued in U.S. Appl. No. 12/755,259.
US Notice of Allowance, dated Sep. 6, 2019, issued in U.S. Appl. No. 15/958,662.
US Notice of Allowance, dated Sep. 9, 2015, issued in U.S. Appl. No. 14/097,160.
US Notice of Allowance (Supplemental Notice of Allowability), dated Apr. 16, 2015, issued in U.S. Appl. No. 13/633,502.
US Office Action, dated Apr. 16, 2012, issued in U.S. Appl. No. 13/276,170.
US Office Action, dated Apr. 17, 2006, issued in U.S. Appl. No. 10/815,560.
US Office Action, dated Apr. 19, 2012, issued in U.S. Appl. No. 12/829,119.
US Office Action, dated Apr. 3, 2009, issued in U.S. Appl. No. 11/305,368.
US Office Action, dated Apr. 4, 2019, issued in U.S. Appl. No. 15/958,662.
US Office Action, dated Apr. 7, 2014, issued in U.S. Appl. No. 13/633,502.
US Office Action, dated Aug. 21, 2008, issued in U.S. Appl. No. 11/265,531.
US Office Action, dated Aug. 5, 2009, issued in U.S. Appl. No. 11/951,236.
US Office Action, dated Aug. 6, 2012, issued in U.S. Appl. No. 13/095,734.
US Office Action, dated Dec. 11, 2014, issued in U.S. Appl. No. 14/173,733.
US Office Action dated Dec. 18, 2012, issued in U.S. Appl. No. 12/723,532.
US Office Action, dated Dec. 18, 2014, issued in U.S. Appl. No. 14/097,160.
US Office Action, dated Dec. 30, 2005, issued in U.S. Appl. No. 10/649,351.
US Office Action, dated Feb. 1, 2016, issued in U.S. Appl. No. 14/723,275.
US Office Action, dated Feb. 15, 2013, issued in U.S. Appl. No. 12/755,248.
US Office Action, dated Feb. 16, 2012, issued in U.S. Appl. No. 12/755,259.
US Office Action, dated Feb. 24, 2014, issued in U.S. Appl. No. 13/020,748.
US Office Action, dated Feb. 8, 2005, issued in U.S. Appl. No. 10/649,351.
US Office Action, dated Jan. 12, 2016, issued in U.S. Appl. No. 14/738,685.
US Office Action, dated Jan. 21, 2016, issued in U.S. Appl. No. 14/135,375.
US Office Action, dated Jan. 25, 2011, issued in U.S. Appl. No. 12/636,616.
US Office Action, dated Jan. 7, 2013, issued in U.S. Appl. No. 12/202,126.
US Office Action, dated Jul. 12, 2005, issued in U.S. Appl. No. 10/815,560.
US Office Action, dated Jul. 12, 2016, issued in U.S. Appl. No. 14/723,270.
US Office Action, dated Jul. 17, 2002, issued in U.S. Appl. No. 09/975,074.
US Office Action dated Jul. 18, 2013, issued in U.S. Appl. No. 12/723,532.
US Office Action, dated Jul. 20, 2017, issued in U.S. Appl. No. 15/398,462.
US Office Action, dated Jul. 26, 2010 issued in U.S. Appl. No. 12/202,126.
US Office Action, dated Jul. 28, 2016, issued in U.S. Appl. No. 14/723,275.
US Office Action, dated Jul. 7, 2016, issued in U.S. Appl. No. 14/989,444.
US Office Action, dated Jun. 11, 2009, issued in U.S. Appl. No. 11/963,698.
US Office Action, dated Jun. 11, 2010, issued in U.S. Appl. No. 11/963,698.
US Office Action, dated Jun. 14, 2011, issued in U.S. Appl. No. 12/556,490.
US Office Action, dated Jun. 14, 2013, issued in U.S. Appl. No. 13/633,798.
US Office Action, dated Jun. 20, 2013, issued in U.S. Appl. No. 13/560,688.
US Office Action, dated Jun. 22, 2004, issued in U.S. Appl. No. 10/435,010.
US Office Action, dated Jun. 24, 2009, issued in U.S. Appl. No. 12/030,645.
US Office Action, dated Jun. 27, 2008, issued in U.S. Appl. No. 11/305,368.
US Office Action, dated Jun. 30, 2011, issued in U.S. Appl. No. 12/829,119.
US Office Action, dated Jun. 4, 2009, issued in U.S. Appl. No. 11/349,035.
US Office Action, dated Mar. 23, 2005, issued in U.S. Appl. No. 10/690,492.
US Office Action, dated Mar. 6, 2012, issued in U.S. Appl. No. 13/244,016.
US Office Action, dated May 10, 2012, issued in U.S. Appl. No. 13/020,748.
US Office Action, dated May 13, 2011, issued in U.S. Appl. No. 12/755,248.
US Office Action, dated May 2, 2011, issued in U.S. Appl. No. 12/407,541.
US Office Action, dated May 29, 2015, issued in U.S. Appl. No. 13/949,092.
US Office Action, dated May 3, 2010, issued in U.S. Appl. No. 12/407,541.

(56) References Cited

OTHER PUBLICATIONS

US Office Action, dated May 30, 2014, issued in U.S. Appl. No. 13/862,048.
US Office Action, dated May 6, 2015, issued in U.S. Appl. No. 14/135,375.
US Office Action, dated Nov. 23, 2005, issued in U.S. Appl. No. 10/984,126.
US Office Action, dated Nov. 23, 2010, issued in U.S. Appl. No. 12/538,770.
US Office Action, dated Oct. 16, 2008, issued in U.S. Appl. No. 11/349,035.
US Office Action dated Oct. 21, 2009, issued in U.S. Appl. No. 12/202,126.
US Office Action, dated Oct. 24, 2018, issued in U.S. Appl. No. 15/415,800.
US Office Action, dated Oct. 28, 2011, issued in U.S. Appl. No. 12/755,248.
US Office Action, dated Sep. 18, 2014, issued in U.S. Appl. No. 13/928,216.
US Office Action, dated Sep. 19, 2016, issued in U.S. Appl. No. 13/949,092.
US Office Action, dated Sep. 28, 2006, issued in U.S. Appl. No. 10/815,560.
US Office Action, dated Sep. 29, 2008, issued in U.S. Appl. No. 11/782,570.
US Office Action Restriction/Election dated Sep. 9, 2021 issued in U.S. Appl. No. 17/250,014.
U.S. Appl. No. 13/758,928, Inventors Humayun et al., filed Feb. 4, 2013.
U.S. Appl. No. 17/907,959, inventors Birru et al., filed Aug. 29, 2022.
U.S. Restriction requirement dated Apr. 20, 2023 in U.S. Appl. No. 17/633,562.
U.S. Restriction requirement dated Jun. 15, 2023 in U.S. Appl. No. 17/601,918.
U.S. Supplemental Notice of Allowance dated Dec. 14, 2022 in U.S. Appl. No. 17/250,014.
Wikipedia "Atomic layer deposition" [webpage] Mar. 25, 2020, pp. 1-9. retrieved from, URL: https://ja.wikipedia.org/w/index.php?title= Atomic Layer Deposition & oldid = 76757564.
CN Office Action dated Feb. 18, 2024 in CN Application No. 201880059689.1, with English Translation.
CN Office Action dated Jan. 9, 2024 in CN Application No. 201910418672.7 with English Translation.
CN Office Action dated Jan. 26, 2024 in CN Application No. 202080027971.9, with English Translation.
CN Office Action dated Jul. 26, 2024 in CN Application No. 202110914064.2, with English Translation.
CN Office Action dated Jul. 30, 2024 in CN Application No. 202080057266.3, with English Translation.
CN Office Action dated Jun. 4, 2024 in CN Application No. 202080027971.9 with English translation.
CN Office Action dated Jun. 26, 2024 in CN Application No. 201980092041.9 with English translation.
CN Office Action dated May 31, 2024 in CN Application No. 201980038600.8 with English translation.
International Preliminary Report on Patentability and Written Opinion dated Jun. 27, 2024 in PCT Application No. PCT/US2022/052437.
International Preliminary Report on Patentability dated Jun. 1, 2023, in Application No. PCT/US2021/059473.
International Search Report and Written Opinion dated Apr. 21, 2023 in PCT Application No. PCT/US2022/052437.
International Search Report and Written Opinion dated Mar. 10, 2022, in Application No. PCT/US2021/059473.
JP Office Action dated Jan. 30, 2024 in JP Application No. JP2021-533642, with English Translation.
JP Office Action dated Jul. 9, 2024 in JP Application No. 2021-533642 with English translation.
JP Office Action dated Mar. 19, 2024 in JP Application No. 2020-561743, with English Translation.
KR Office Action dated Mar. 11, 2024 in KR Application No. 10-2020-7007526 with English translation.
KR Office Action dated May 7, 2024 in KR Application No. 10-2020-7034800, with English Translation.
U.S. Final Office Action dated Dec. 20, 2023 in U.S. Appl. No. 17/633,562.
U.S. Notice of Allowance dated Apr. 19, 2024 in U.S. Appl. No. 17/633,562.
U.S. Notice of Allowance dated Dec. 19, 2023 in U.S. Appl. No. 17/312,594.
U.S. Notice of Allowance dated Jan. 2, 2024 in U.S. Appl. No. 17/312,594.
U.S. Notice of Allowance dated Jan. 23, 2024 in U.S. Appl. No. 17/601,918.
U.S. Notice of Allowance dated Jan. 31, 2024 in U.S. Appl. No. 17/601,918.
U.S. Notice of Allowance dated Mar. 27, 2024 in U.S. Appl. No. 17/312,594.
U.S. Notice of Allowance dated May 3, 2024 in U.S. Appl. No. 17/601,918.
U.S. Notice of Allowance dated May 16, 2024 in U.S. Appl. No. 17/633,562.
U.S. Appl. No. 18/717,972, inventor Chen K, filed Jun. 7, 2024.
SG Written Opinion dated Jul. 31, 2024 in SG Application No. 11202111277U.
TW Office Action dated Sep. 6, 2024 in TW Application No. 110107688 with English translation.
KR Office Action dated Dec. 12, 2024 in KR Application No. 10-2021-7041894, with English Translation.

* cited by examiner

NUCLEATION-FREE TUNGSTEN DEPOSITION

INCORPORATION BY REFERENCE

A PCT Request Form is filed concurrently with this specification as part of the present application. Each application that the present application claims benefit of or priority to as identified in the concurrently filed PCT Request Form is incorporated by reference herein in its entirety and for all purposes.

BACKGROUND

Deposition of conductive materials such as tungsten films is an integral part of many semiconductor fabrication processes. These materials may be used for horizontal interconnects, vias between adjacent metal layers, contacts between metal layers and devices on the silicon substrate, and high aspect ratio features. As devices shrink and more complex patterning schemes are utilized in the industry, deposition of thin tungsten films becomes a challenge. These challenges include depositing low resistivity films having good step coverage.

The background and contextual descriptions contained herein are provided solely for the purpose of generally presenting the context of the disclosure. Much of this disclosure presents work of the inventors, and simply because such work is described in the background section or presented as context elsewhere herein does not mean that it is admitted to be prior art.

SUMMARY

Provided herein are methods for forming tungsten bulk layers. One aspect of the disclosure relates to a method including depositing a tungsten bulk layer without depositing a tungsten nucleation layer on a surface of a substrate by forming a layer including elemental boron (B) on the surface; and after forming the layer, performing multiple cycles of exposing the substrate to alternating pulses of a tungsten fluoride compound and hydrogen ($H_2$) to thereby form an elemental tungsten bulk layer on the surface. In some embodiments, the layer including elemental boron is between 10 and 50 Angstroms thick. In some embodiments, the B content at the interface of the elemental tungsten bulk layer and the surface is no more than $10^{21}$ atoms/cm$^3$. In some embodiments, the B content is no more than $5\times10^{20}$ atoms/cm$^2$. In some embodiments, the B content is no more than $2\times10^{20}$ atoms/cm$^2$.

In some embodiments, the layer including elemental boron consists essentially of boron. In some embodiments, the layer including elemental boron further includes silicon. In some embodiments, the layer consists essentially of boron and silicon.

In some embodiments, the surface is a nitride surface, with examples including a titanium nitride (TiN) surface. In some embodiments, the surface is an oxide surface.

In some embodiments, forming the layer including elemental boron involves exposing the surface to diborane. Example exposure times may range from 30 to 120 seconds. In some embodiments, forming the layer including elemental boron involves exposing the surface to diborane and silane.

In some embodiments, a chamber pressure of a chamber housing the substrate during formation of the layer comprising elemental boron is between 10 Torr and 90 Torr.

In some embodiments, the operations of forming the layer comprising elemental boron and performing multiple cycles are performed in the same chamber. In some embodiments, the method further involves lowering the chamber pressure after forming the layer comprising elemental boron and prior to performing the multiple cycles.

In some embodiments, forming a layer comprising elemental boron (B) on the surface includes exposing the surface to a gas mixture comprising boron (B) and silicon (Si) wherein the B:Si ratio is between 1:1 and 6:1. In some embodiments, the gas mixture includes diborane and silane.

In some embodiments, forming a layer comprising elemental boron (B) on the surface involves thermal decomposition of a boron-containing reducing agent without adsorption of the boron-containing reducing agent on the surface. In some embodiments, the layer of elemental boron conforms to the surface topography.

Apparatuses to perform the methods are also provided. These and other aspects of the disclosure are discussed further below with reference to the drawings.

DETAILED DESCRIPTION

Figure 1A:
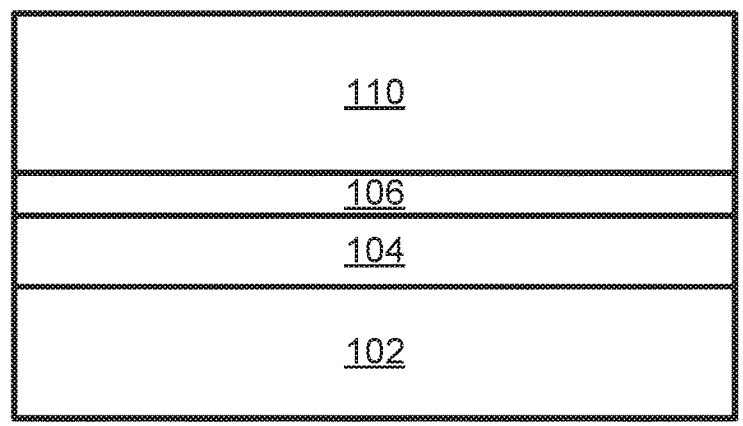
FIGS. 1A and 1B depict example metal stacks that include bulk tungsten.

Provided herein are methods and apparatuses for forming metal films such as tungsten (W) films on semiconductor substrates. The methods involve forming a sacrificial layer of a silicon (Si) and/or boron (B) prior to deposition of a bulk layer of the metal on the substrate. The sacrificial layer reacts with a metal precursor to form part of the bulk layer.

In this manner, tungsten can be deposited directly on surfaces such as diffusion barrier or dielectric surfaces without deposition of a nucleation layer. Apparatuses to perform the methods are also provided.

Forming electrical contacts or lines in semiconductor device fabrication can involve filling features with tungsten or other electrically conductive materials. A nucleation layer can first be deposited into a via or contact. A nucleation layer is a thin conformal layer that serves to facilitate the subsequent formation of a bulk material thereon. A tungsten nucleation layer may be deposited to conformally coat the sidewalls and, if present, bottom of the feature. After the tungsten nucleation layer is deposited, bulk tungsten may be deposited on the tungsten nucleation layer. Unlike a nucleation layer, which is a thin conformal film that serves to facilitate the subsequent formation of a bulk material thereon, bulk tungsten is used to carry current. Bulk tungsten is compositionally distinct from a tungsten nucleation layer such that there is an interface between the bulk tungsten and nucleation layer. In some cases, nucleation layers have relatively high amorphous and/or beta phase content, while bulk layers have high alpha phase content. Bulk tungsten also has large grain size and lower resistivity than a nucleation layer.

There are various challenges in tungsten fill as devices scale to smaller technology nodes and more complex patterning structures are used. One challenge is distribution of material with a structure. Distribution of a material within a feature may be characterized by its step coverage. For the purposes of this description, "step coverage" is defined as a ratio of two thicknesses—the thickness of the material inside the feature divided by the thickness of the material near the opening. For purposes of this document, the term "inside the feature" represents a middle portion of the feature located about the middle point of the feature along the feature's axis, e.g., an area between about 25% and 75% of the distance or, in certain embodiments, between about 40% and 60% of the distance along the feature's depth measured from the feature's opening, or an end portion of the feature located between about 75% and 95% of the distance along the feature's axis as measured from the opening. The term "near the opening of the feature" or "near the feature's opening" represents a top portion of the feature located within 25% or, more specifically, within 10% of the opening's edge or other element representative of the opening's edge. Step coverage of over 100% can be achieved, for example, by filling a feature wider in the middle or near the bottom of the feature than at the feature opening.

Another challenge is reducing resistance in the deposited tungsten films. Thinner films tend to have higher resistance than thicker films. As features become smaller, the tungsten contact or line resistance increases due to scattering effects in the thinner tungsten films. Low resistivity tungsten films minimize power losses and overheating in integrated circuit designs. Tungsten nucleation layers typically have higher electrical resistivities than the overlying bulk layers. Further, tungsten nucleation films occupy a larger percentage of smaller features, increasing the overall resistance in the feature. Resistivity of a tungsten film depends on the thickness of the film deposited, such that resistivity increases as thickness decreases due to boundary effects.

Another challenge is reducing stress on deposited films. Thinner tungsten films tend to have increased tensile stress. Depositing bulk tungsten films by chemical vapor deposition can result in a tensile stress greater than 2.5 GPa for a 200 Å film. High thermal tensile stress causes the substrate to curl, which makes subsequent processing difficult. For example, subsequent processes may include chemical mechanical planarization, deposition of materials, and/or clamping of the substrate to a substrate holder to perform processes in a chamber. However, these processes often rely on the substrate being flat, and a curled substrate results in nonuniform processing or inability to process the substrate. Although there are existing methods for reducing stress in films of other materials such as annealing, tungsten does not have the surface mobility to allow grains to be moved or altered once it is deposited due to its high melting point.

One aspect of the disclosure relates to methods of depositing tungsten films without depositing a nucleation layer. In certain embodiments, the methods involve depositing a conformal reducing agent layer of silicon (Si) and/or boron (B) on a substrate. The substrate generally includes a feature to be filled with tungsten as described above, with the reducing agent layer conformal to the topography of the substrate including the feature. The reducing agent layer is then exposed to a fluorine-containing tungsten precursor, which is reduced by the reducing agent layer to form a layer of elemental tungsten. The conformal reducing agent layer is converted to a conformal tungsten layer. According to various embodiments, the fluorine-containing tungsten precursor may or may not be provided in the presence of hydrogen ($H_2$) gas.

According to various embodiments, one or more of the following advantages may be realized using the methods described herein. Tungsten films deposited using the nucleation-free methods described herein can have lower resistivity than tungsten films deposited on nucleation layers. Tungsten films deposited using the nucleation-free methods described herein can have lower B, Si, or B and Si concentration than tungsten films deposited on nucleation layers formed using boron-containing and/or silicon-containing reducing agents. Tungsten films deposited using the nucleation-free methods described herein can have large grain size without a grain boundary at nucleation—bulk interface. In some embodiments, grain size and orientation can be controlled by the amount of B or B and Si in the reducing agent layer. In some embodiments, higher throughput may be achieved due to not forming a nucleation layer.

In some embodiments, the conversion described above occurs as part of a bulk tungsten deposition process. The bulk tungsten deposition process may use $H_2$ as a reducing agent and grow tungsten bulk film from the substrate surface on which the Si and/or B layer was previously deposited. Unlike a bulk film deposited on a nucleation layer, the resulting tungsten film stack has no nucleation layer/bulk layer interface.

In some embodiments, if the conformal reducing agent layer is the only available reducing agent for the fluorine-containing tungsten precursor, excess precursor may be used to ensure complete conversion to tungsten. The conversion is self-limiting, with its step coverage defined by the step coverage of the reducing agent layer.

In some embodiments, the reducing agent layer and the subsequent tungsten layer is formed directly on an oxide surface, such as a silicon oxide (e.g., $SiO_2$) or aluminum oxide (e.g., $Al_2O_3$) surface. This eliminates the need for an adhesion/barrier layer such as a titanium nitride (TiN) layer or titanium/titanium nitride (Ti/TiN) bilayer.

Methods described herein are performed on a substrate that may be housed in a chamber. The substrate may be a silicon wafer, e.g., a 200-mm wafer, a 300-mm wafer, or a 450-mm wafer, including wafers having one or more layers of material, such as dielectric, conducting, or semi-conducting material deposited thereon.

Figure 1B:
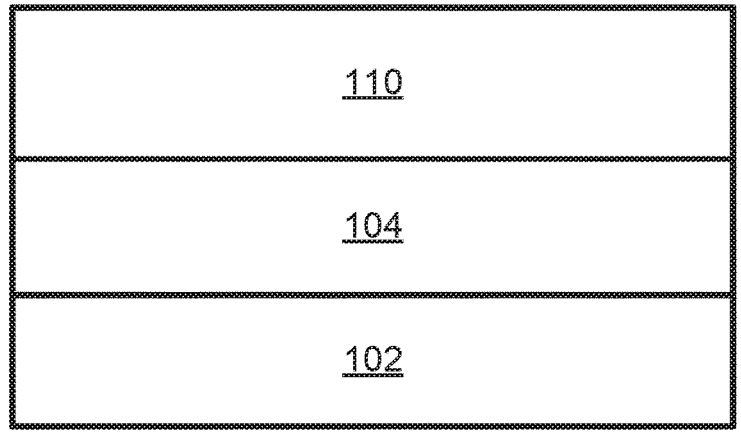

FIGS. 1A and 1B are schematic examples of material stacks that include a bulk tungsten layer directly contacting on an underlying layer without an intervening nucleation layer. FIGS. 1A and 1B illustrate the order of materials in a particular stack and may be used with any appropriate architecture and application, as described further below with respect to FIGS. 2, 3A, and 3B. In the example of FIG. 1A, a substrate 102 has a nucleation layer 108 deposited thereon. The substrate 102 may be a silicon or other semiconductor wafer, e.g., a 200-mm wafer, a 300-mm wafer, or a 450-mm wafer, including wafers having one or more layers of material, such as dielectric, conducting, or semi-conducting material deposited thereon. The methods may also be applied to form metallization stack structures on other substrates, such as glass, plastic, and the like.

In FIG. 1A, a dielectric layer 104 is on the substrate 102. The dielectric layer 104 may be deposited directly on a semiconductor (e.g., Si) surface of the substrate 102, or there may be any number of intervening layers. Examples of dielectric layers include doped and undoped silicon oxide, silicon nitride, and aluminum oxide layers, with specific examples including doped or undoped layers $SiO_2$ and $Al_2O_3$. Also, in FIG. 1A, a diffusion barrier layer 106 is disposed between the dielectric layer 104 and a bulk tungsten layer 110. Examples of diffusion barrier layers including titanium nitride (TiN), titanium/titanium nitride (Ti/TiN), tungsten nitride (WN), and tungsten carbon nitride (WCN). The bulk tungsten layer 110 is deposited on the diffusion barrier layer 106 and is the main conductor (also referred to as a bulk conductor or bulk layer) of the structure.

FIG. 1B shows another example of a material stack 190. In this example, the stack includes the substrate 102, dielectric layer 104, with the nucleation layer 108 deposited directly on the dielectric layer 104, without an intervening diffusion barrier layer. As in the example of FIG. 1A, a bulk tungsten layer 110 is deposited on the nucleation layer 108 and is the main conductor of the structure.

While FIGS. 1A and 1B show examples of metallization stacks, the methods and resulting stacks are not so limited and include any tungsten having a tungsten bulk layer. The methods described herein are performed on a substrate that may be housed in a chamber.

Figure 2:
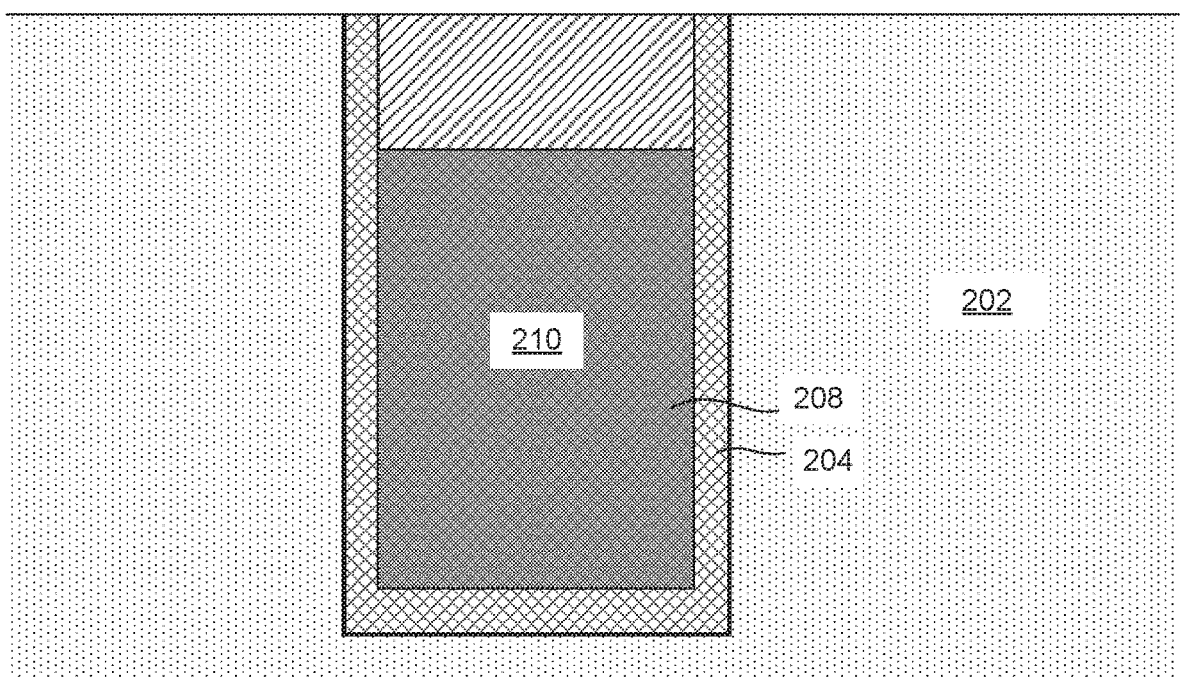
FIG. 2 depicts a schematic example of a buried wordline (bWL) structure that includes tungsten.
Figure 3A:
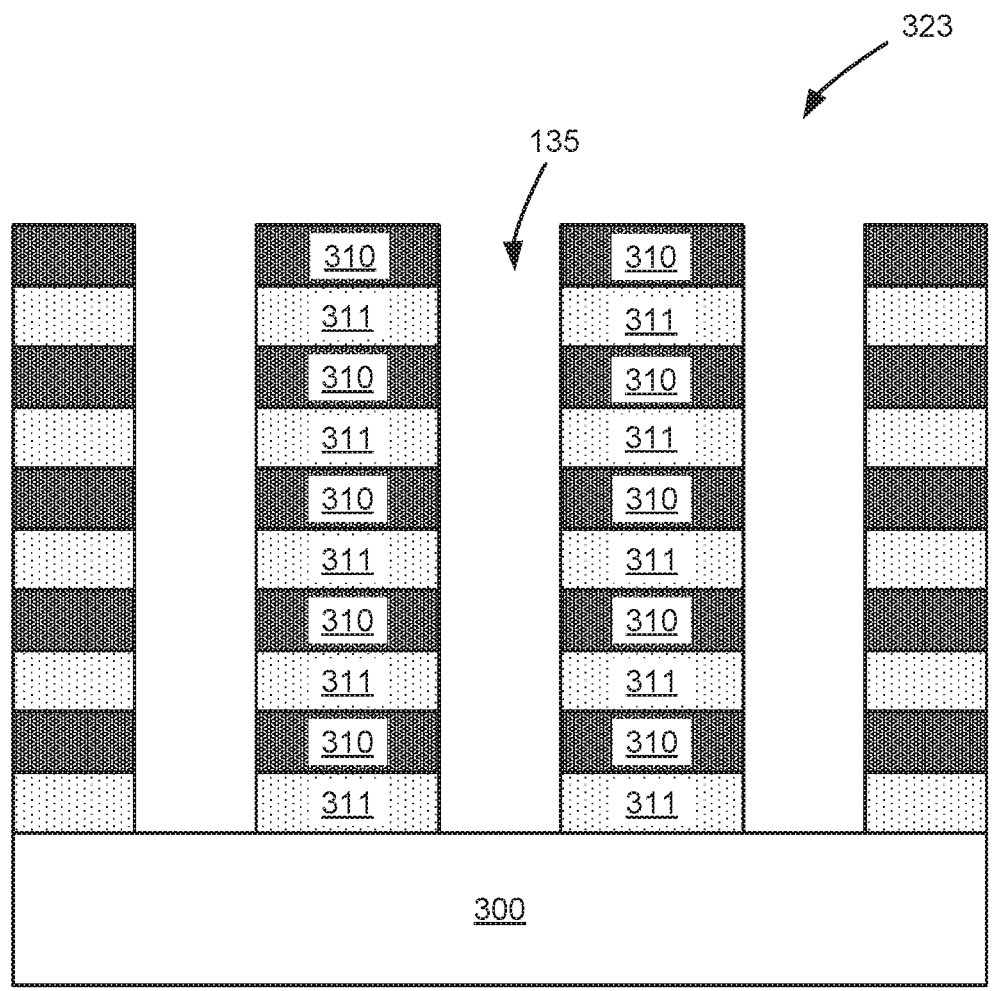
FIG. 3A depicts a schematic example of tungsten wordlines in a 3D NAND structure.
Figure 3B:
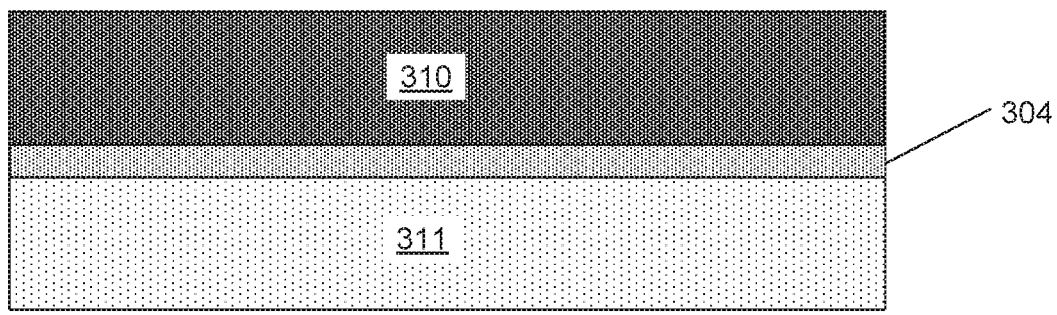
FIG. 3B depicts a detail of the interface between a tungsten wordline and an oxide layer in a 3D NAND structure.

The material stacks described above and further below may be implemented in a variety of structures. FIGS. 2, 3A, and 3B provide examples of structures in which the stacks may be employed. FIG. 2 depicts a schematic example of a DRAM architecture including a buried wordline (bWL) 210 in a silicon substrate 202. The bWL 210 is formed in a trench etched in the silicon substrate 202. Lining the trench is an insulating layer 204 that is disposed between the bWL 210 and the silicon substrate 202. In the example of FIG. 2, the insulating layer 204 may be a gate oxide layer, formed from a high-k dielectric material such as a silicon oxide or silicon nitride material. In some embodiments, a conformal barrier layer such as TiN or a tungsten-containing layer may be interposed between the bWL 210 and the insulating layer 204.

FIG. 3A depicts a schematic example of wordlines 310 in a 3D NAND structure 323 formed on a substrate 300. The wordlines 310 are separated by oxide layers 311. In FIG. 3B, a detail of the interface between a wordline 310 and oxide layer 311 is shown with a layer of TiN 304. In some embodiments, bulk tungsten of the tungsten wordline 310 may be deposited directly on the oxide layer 311 (or layer of aluminum oxide if present) or on a TiN or other barrier layer as described herein. Example thicknesses of wordline 310 may be between about 10 nm and 100 nm thick.

Figure 3C:
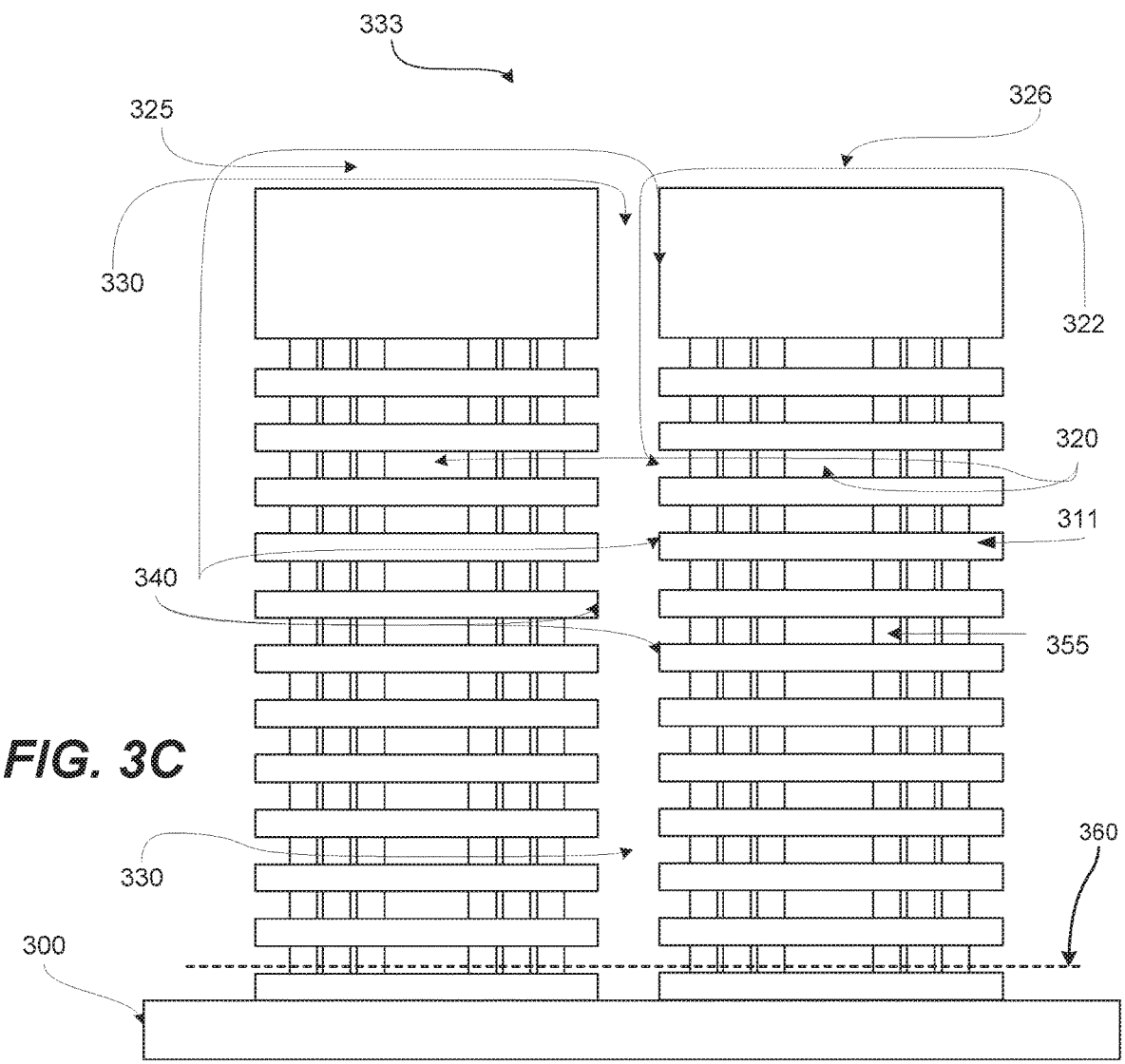
FIG. 3C depicts a schematic cross-sectional side view of a partially fabricated 3-D NAND structure.

FIG. 3C presents a cross-sectional side view of a partially fabricated 3-D NAND structure 333 and illustrates challenges of metal fill. The structure 330 is formed on a semiconductor substrate 300 and includes 3D NAND stacks (left 325 and right 326), central vertical structure 330, and a plurality of stacked wordline features 320 with openings 322 on opposite sidewalls 340 of central vertical structure 330. Note that FIG. 3C displays two stacks 325 and 326 of the exhibited partially fabricated 3-D NAND structure 333, which together form the trench-like central vertical structure 330, however, in certain embodiments, there may be more than two stacks arranged in sequence and running spatially parallel to one another, the gap between each adjacent pair of stacks forming a central vertical structure 330, like that explicitly illustrated in FIG. 3C. In the example of FIG. 3C, the wordline features 320 are fluidically accessible from the central vertical structure 330 through the openings 322. Although not explicitly indicated in the figure, the horizontal features 320 present in both the 3-D NAND stacks 325 and 326 shown in FIG. 3C (i.e., the left 3-D NAND stack 325 and the right 3-D NAND stack 326) are also accessible from the other sides of the stacks (far left and far right, respectively) through similar vertical structures formed by additional 3-D NAND stacks (to the far left and far right, but not shown). In other words, each 3-D NAND stack 325, 326 contains a stack of wordline features that are fluidically accessible from both sides of the 3-D NAND stack through a central vertical structure 330.

The wordline features in a 3-D NAND stack may be formed by depositing an alternating stack of silicon oxide and silicon nitride layers, and then selectively removing the nitride layers leaving a stack of oxide layers 311 having gaps between them. These gaps are the wordline features 320. Any number of wordlines may be vertically stacked in such a 3-D NAND structure so long as there is a technique for forming them available, as well as a technique available to successfully accomplish substantially void-free fills of the vertical features. Thus, for example, a 3D-NAND stack may include between 2 and 256 horizontal wordline features, or between 8 and 128 horizontal wordline features, or between 16 and 64 horizontal wordline features, and so forth (the listed ranges understood to include the recited end points).

Figure 3D:
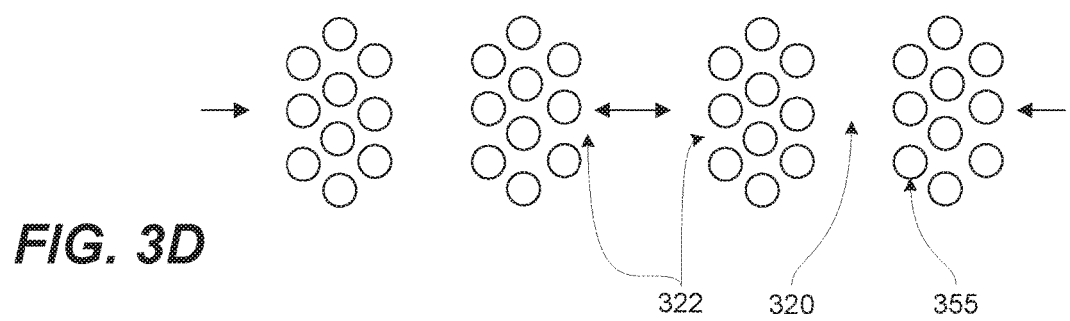
FIG. 3D depicts a schematic top view of a partially fabricated 3-D NAND structure.

FIG. 3D presents a cross-sectional top-down view of the same 3-D NAND structure shown in FIG. 3C with the cross-section taken through the horizontal section 360 as indicated by the dashed horizontal line in FIG. 3C. The cross-section of FIG. 3C illustrates several rows of pillars 355, which are run vertically from the base of semiconductor substrate 300 to the top of the 3-D NAND stacks. In some embodiments, these pillars 355 are formed from a polysilicon material and are structurally and functionally significant to the 3-D NAND structure 333. In some embodiments, such polysilicon pillars may serve as gate electrodes for stacked memory cells formed within the pillars. The top-view of FIG. 3D illustrates that the pillars 355 form constrictions in the openings 322 to wordline features 320—i.e. fluidic accessibility of wordline features 320 from the central vertical structure 330 via openings 322 (as indicated by the arrows in FIG. 3D) is inhibited by pillars 355. In some embodiments, the size of the horizontal gap between adjacent polysilicon pillars is between about 1 and 20 nm. This reduction in fluidic accessibility increases the difficulty of uniformly filling wordline features 320 with conductive material.

Figure 4:
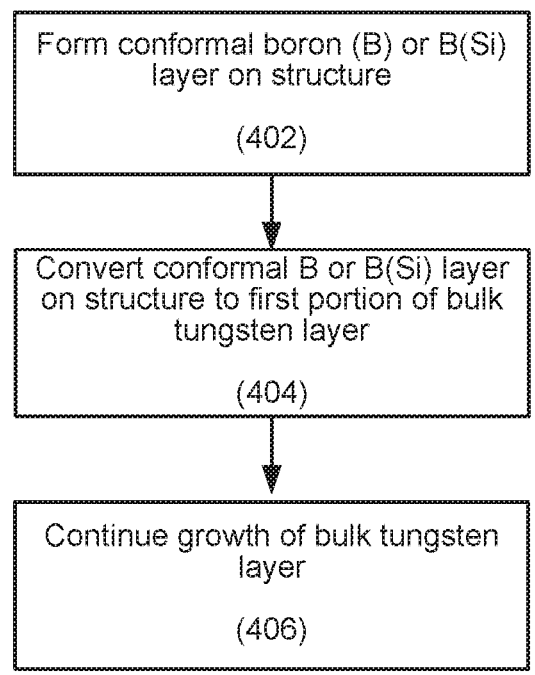
FIG. 4 is a process flow diagram illustrating operations of a method of depositing a bulk tungsten layer without a nucleation layer.

FIG. 4 is a process flow diagram of a method performed in accordance with disclosed embodiments. Operations 402-408 may be performed to deposit a bulk tungsten layer on a structure without first depositing a nucleation layer. That is, these operations are formed without prior deposition of a nucleation layer. Prior to operation 402, a substrate having a structure with one or more features to be filled without a nucleation layer may be provided to a process chamber. In some embodiments, the surface on which the bulk tungsten layer is deposited is a barrier layer such as a titanium nitride (TiN) or tungsten carbon nitride (WCN) layer. In some embodiments, the surface on which the bulk tungsten layer is deposited in an oxide or other dielectric layer.

As described below, certain operations are performed at substrate temperatures. It will be understood that substrate temperature refers to a temperature to which the pedestal holding the substrate is set.

In operation 402, a layer of boron (B) or boron and silicon (denoted B(Si)) is formed on the structure. The layer is conformal in that it conforms to the shape of the structure to be filled with a tungsten bulk layer. To form the conformal layer, the structure is exposed to a boron-containing gas and/or a silicon-containing gas. Examples of boron-containing gases include boranes and examples of silicon-containing gases include silanes. Examples of boranes include diborane ($B_2H_6$), as well as $B_nH_{n+4}$, $B_nH_{n+6}$, $B_nH_{n+8}$, $B_nH_m$, where n is an integer from 1 to 10, and m is a different integer than m. Other boron-containing compounds may also be used, e.g., alkyl boranes, alkyl boron, aminoboranes $(CH_3)_2NB(CH_2)_2$, carboranes such as $C_2B_nH_{n+2}$. Examples of silanes including $SiH_4$ and $Si_2H_6$. While other gases may be used, boranes and silanes may advantageously used to have a layer of B and/or Si without impurities.

In some embodiments, a carrier gas may be flowed during operation 402. In some embodiments, a carrier gas, such as nitrogen ($N_2$), argon (Ar), helium (He), or other inert gases, may be flowed during operation 402. As described further below with respect to FIGS. 5A-5D, operation 402 may involve one or multiple pulses of the gases.

When exposing a surface to a borane, the borane may thermally decompose to form a layer of elemental boron (B) or the borane may be adsorbed onto the substrate. To form a layer of boron on the structure, it is exposed to a borane or other boron-containing gases using conditions under which thermal decomposition will occur. This is in contrast to nucleation layer deposition in which adsorption may be favored.

Nucleation layer deposition may involve sequential alternating pulses of a boron-containing reducing agent and tungsten-containing precursor separated by purges. The pulses are relatively short. Conditions that favor adsorption may be used at least because thermal decomposition using short pulses can lead to poor step coverage over complex structures such as 3D NAND structures. Further, during nucleation layer deposition, relatively low chamber pressures may be used to reduce fluorine incorporation when using a fluorine-containing precursor.

To favor thermal decomposition over adsorption, temperature may be controlled. The substrate temperature at block 402 is thus higher than the decomposition point at that pressure. For diborane, for example, a temperature of 250° C.-400° C. may be used at 40 Torr. Lower temperatures (e.g., 225° C.) may be used for some compounds and conditions. It should also be known that temperatures on the higher end of the range may be harder to control. As such, for diborane, a range of 250° C.-350° C., or 250° C.-300° C. may be used. Example chamber pressures may be between 10 Torr and 90 Torr, or 10 Torr and 50 Tor. Higher pressures can improve step coverage in some embodiments. Pressure during operation 402 may be higher than generally used for nucleation layer deposition. Hydrogen ($H_2$) may or may not be present; the addition of $H_2$ can slow down the formation of the conformal layer. In some embodiments, operation 402 is performed without a purge during operation 402. This also enables higher pressures to be used in some embodiments with purges being more difficult at higher pressures. Thermal decomposition may also be favored by using longer pulse times and/or higher flow rates than used for nucleation layer deposition. Temperature during operation 402 may be higher than generally used for nucleation layer deposition.

In some embodiments, $SiH_4$, or other silane or silicon-containing compound is also used in operation 402 with elemental silicon (Si) also incorporated into the conformal layer. Thermal decomposition of silane on its own is more difficult than that of diborane; however, using silane with diborane has been found to increase deposition rate of the conformal layer. A volumetric flow rate ratio of 1:1 $B_2H_6$:$SiH_4$ was found to provide the fastest deposition rate at 300° C. and 10 Torr; with up to 3:1 also providing good deposition rates. Having more silane than diborane results in reduced deposition rate, with the reduction increasing as the silane content increases. The B:S ratio (flow rates into the chamber as well as in the layer) may be 1:1-6:1 in some embodiments. Volumetric flow rates of $B_2H_6$:$SiH_4$ may be 0.5:1-3:1.

Using both a boron-containing compound and a silicon-containing compound forms a layer including B and Si. It is possible that some amount of adsorbed silane is present in the layer. Also in some embodiments, silane or other silicon-containing compound only may be used in operation 402. However, as indicated above, deposition rate is much slower and decomposition is more difficult.

Still further, in some other embodiments, the conformal layer may include elemental elemental germanium (Ge) alone or with other constituents. For any of the layers described above, the layers may consist essentially of the elemental reducing agent or mixtures of elemental reducing agents (e.g., B, B(Si), Si, etc.) or other atoms may be present. For example, $SiH_x$, $BH_y$, $GeH_z$, or mixtures thereof where x, y, and z may independently be between 0 and a number that is less than the stoichiometric equivalent of the corresponding reducing agent compound may be present. A layer that consists essentially of a reducing agent will have no more than trace amounts of other atoms.

Example thicknesses of the conformal B or B(Si) layer are 1-5 nm. In some embodiments, the thickness is below 3 nm. If the layer is too thick, it may not all be converted to tungsten; too thin, and it may not result in uniform and continuous film growth.

Operation 402 may be performed using continuous flow or pulses of the one or more reducing agents. FIGS. 5A-5D, described further below, show examples of pulsed flow sequences.

In operation 404, the conformal B or B(Si) (or other conformal layer as described above) is converted to a first portion of a bulk tungsten layer. Operation 404 involves exposing the conformal B or B(Si) layer to a tungsten-containing precursor, typically a fluoride-containing tungsten precursor such as $WF_6$. Operation 404 may involve one or more $WF_6$ pulses or $WF_6$ and $H_2$ pulses. Operation 404 generally continues until the B or B(Si) layer is fully converted. The result in a layer of elemental tungsten (W). An example reaction is:

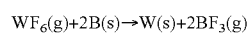

$$WF_6(g) + 2B(s) \rightarrow W(s) + 2BF_3(g)$$

In some embodiments, pressure during operation 404 is below 20 Torr, e.g., 10 Torr, or below 10 Torr. In some embodiments, a carrier gas, such as argon (Ar), helium (He), or other inert gases, may be flowed during operation 404. In various embodiments, during operation 404, the amount of precursor by volume may be between about 2% and about 10%.

Once the B or B(Si)layer is converted, growth of the bulk tungsten layer is continued in an operation 406. As discussed further below, this operation can involve ALD deposition of bulk tungsten using $H_2$ a reducing agent. Thus, in some embodiments, after operation 402, repeated cycles of an ALD sequence a tungsten-containing precursor and $H_2$ (e.g., $WF_6$/purge/$H_2$/purge) are performed to initiate and complete operations 404 and 406.

To deposit a B layer, diborane or other boron-containing reducing agent is flowed into the deposition chamber. This may be done as a continuous flow or in pulses (see, e.g., FIG. 5A). Hydrogen or other carrier gas may or may not be present. Diborane or other boron-containing reducing gas may be provided in dilute form, e.g., 5% diborane by volume with the balance nitrogen ($N_2$) gas. As noted above, example substrate temperatures 250° C.-300° C. and chamber pressures of 10-90 Torr may be used. To deposit a B(Si) layer, higher substrate temperatures, e.g., 250° C.-400° C. may be used. Chamber pressures of 10-90 Torr may also be used for B(Si) layers. In addition to a boron-containing reducing agent, a silicon-containing reducing agent is flowed in the deposition chamber. This may take the form of sequential single B-containing reducing agent and Si-containing reducing agent pulses (see FIG. 5B) or sequential multiple single B-containing reducing agent and Si-containing reducing agent pulses (see FIG. 5C). In some embodiments, the B-containing and Si-containing reducing agents are co-flowed into the deposition chamber, either in a continuous flow or in pulses.

Figure 5A:
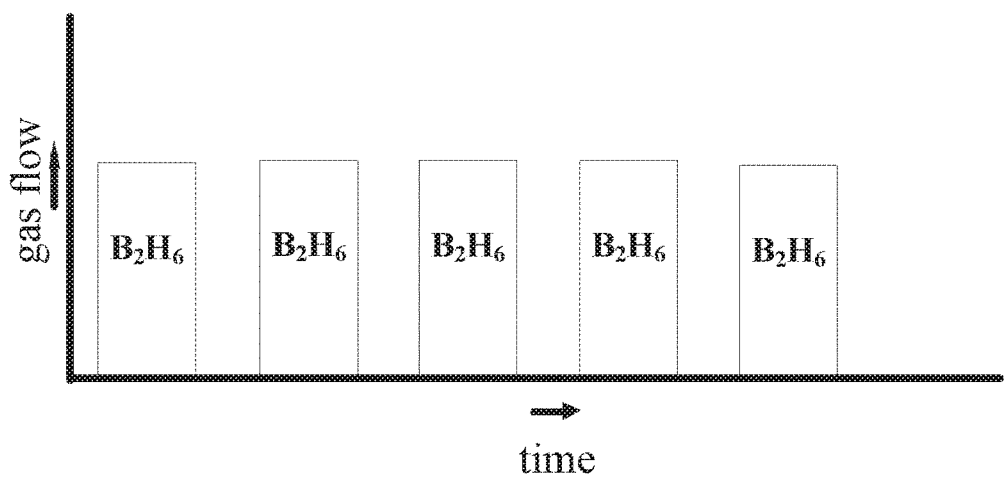
FIGS. 5A-5D show examples of pulsed flow sequences of reducing agents that may be used to deposit boron (B) or boron(silicon) (B(Si)) layers.
Figure 5B:
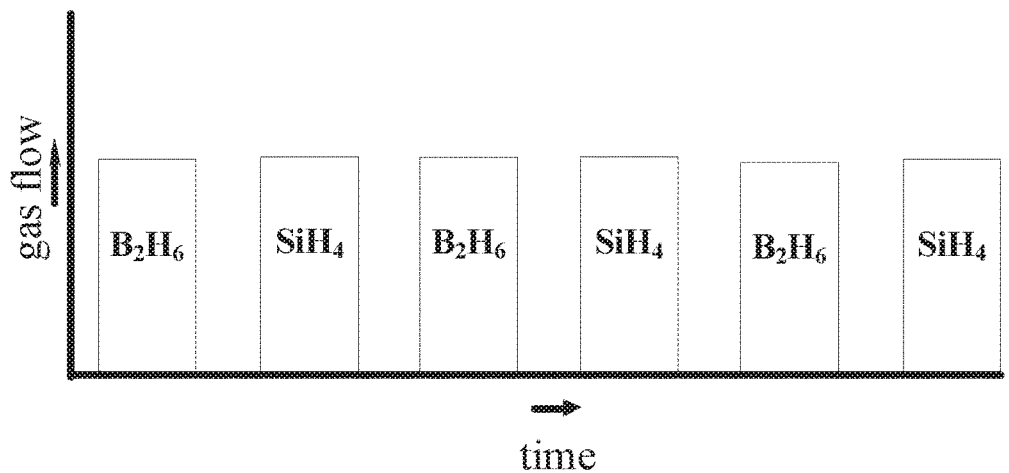
Figure 5C:
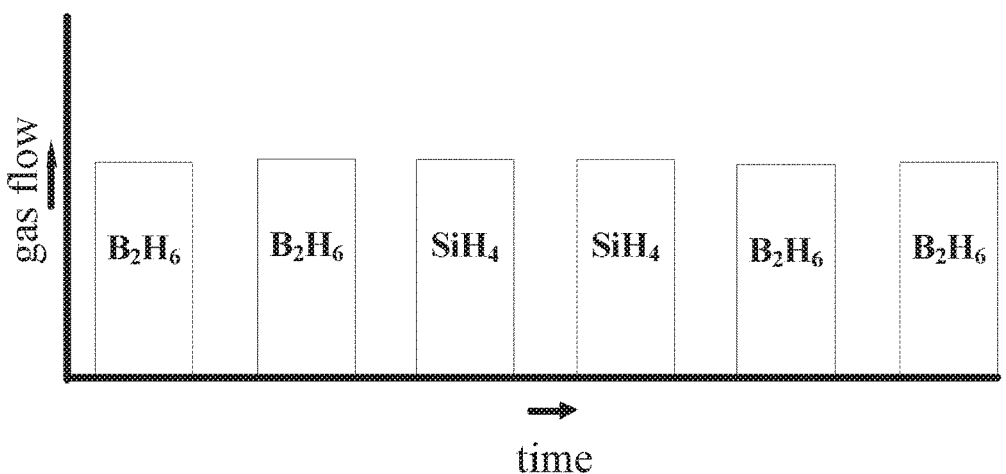
Figure 5D:
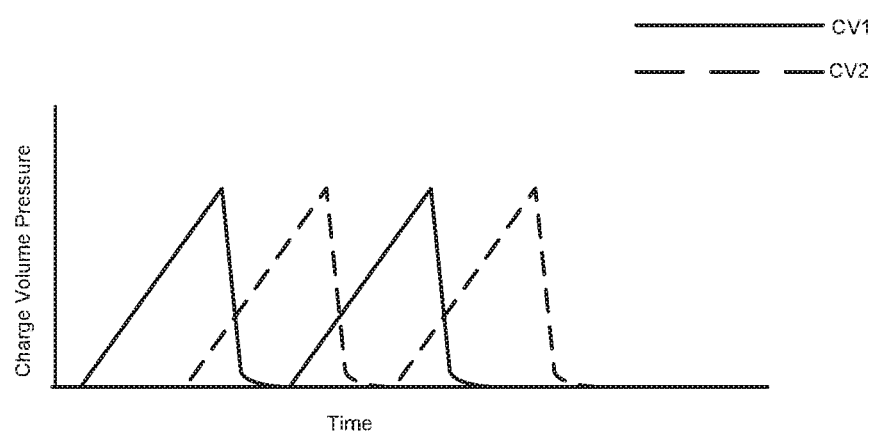

FIG. 5A-5C depict intervals between pulses; purging in the intervals can be but is often not employed in these intervals. In some embodiments, the pulses may overlap. In some embodiments, multiple charge volumes may be used to deliver reducing agent pulses. A charge volume is a container in which a gas accumulates at a charge volume pressure. FIG. 5D shows an example of pressure of two charge volumes (CV1 and CV2) delivering sequential pulses. Each charge volume may contain the same (e.g., $B_2H_6$) or different ($B_2H_6$ and $SiH_4$) reducing agents. Use of a charge volume and especially multiple charge volumes can aid in step coverage throughout a structure. In some embodiments, the discharges may overlap.

Figure 6:
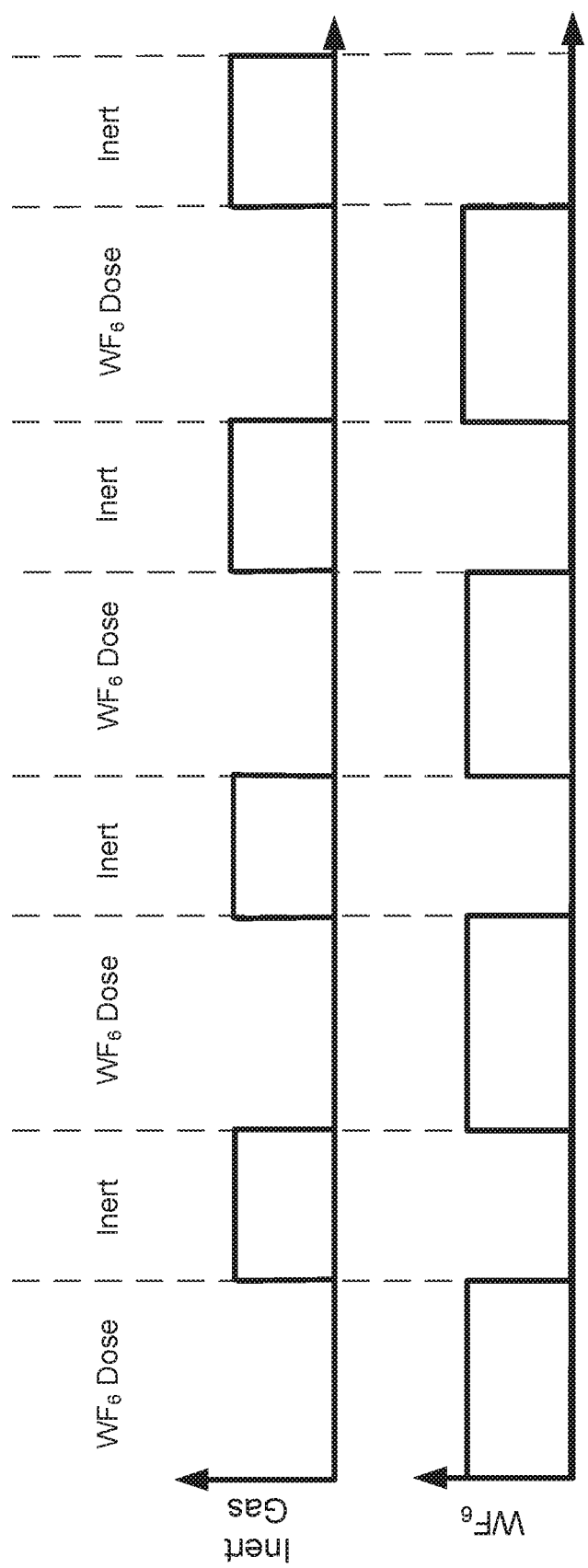
FIG. 6 shows an example of a pulsed flow sequence of a tungsten precursor that may be used to convert a B or B(Si) layer.

As indicated above, to convert the B or B(Si) layer, the substrate is exposed to a tungsten-containing precursor. This may be performed with continuous or pulsed flow. FIG. 6 provides an example of pulsed flow.

Figure 7A:
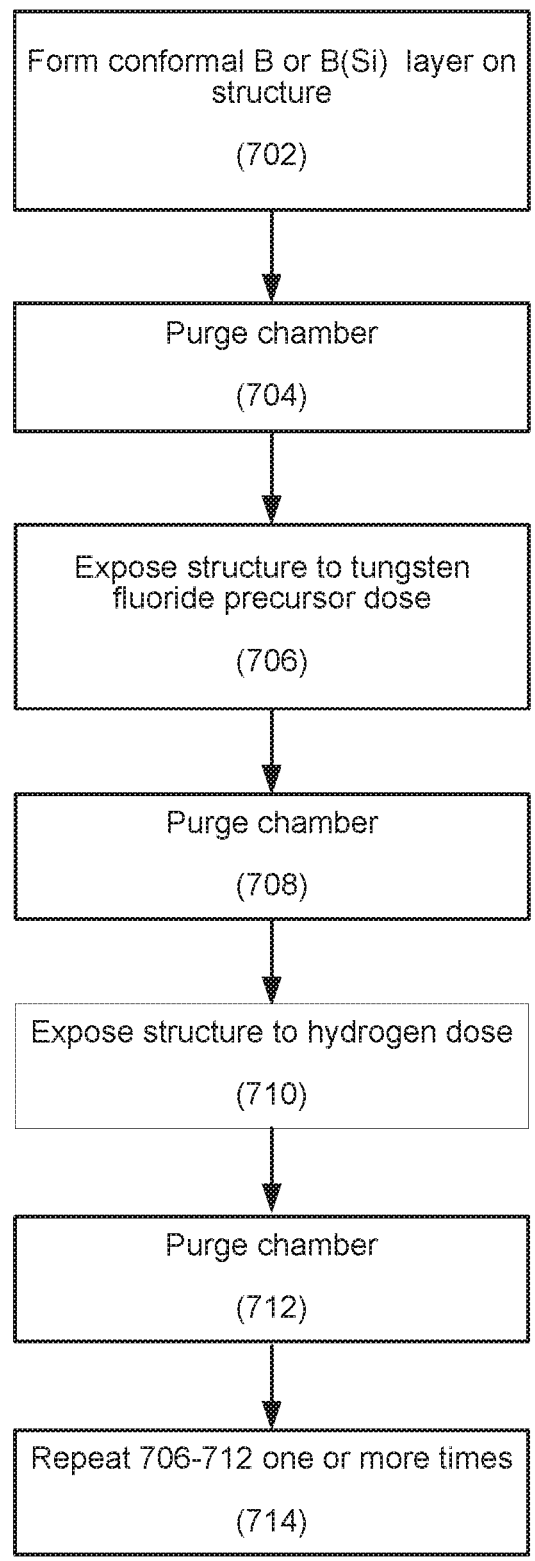
FIG. 7A is a process flow diagram illustrating operations of a method of depositing a bulk tungsten layer without a nucleation layer.

Also provided herein are methods of depositing a bulk tungsten film without depositing a nucleation layer. FIG. 7A provides a process flow diagram illustrating operations in depositing a tungsten bulk layer. First, at operation 702, a conformal B or B(Si) layer is formed on a structure. This may be performed as discussed above with respect to operation 402 of FIG. 7A. In some embodiments, the conformal layer is formed on a nitride barrier layer. In an operation 704, the chamber in which the structure resides may be purged to remove vapor phase reducing agent used to form the conformal layer. Next the structure is exposed to a dose of a tungsten fluoride precursor. (706). In other embodiments, a tungsten chloride precursor may be used. The chamber is purged in an operation 708. The structure is then exposed to a hydrogen ($H_2$) dose at operation 710, followed by a purge at operation 712. Operations 706-712 may be repeated one or more times (714).

In some embodiments, pressure during at least operations 706-712 is relatively low, and can be no more than 40 Torr or no more than 20 Torr. In some embodiments, it is between 5 Torr and 20 Torr, or between 7 and 13 Torr. In a specific example, the pressure is about 10 Torr. In some embodiments, pressure is reduced between operation 702 and operation 706. That is, the B or B(Si) layer may be formed using a high pressure with subsequent operations using a lower pressure. In this manner, a low fluorine tungsten bulk layer is deposited.

Figure 8A:
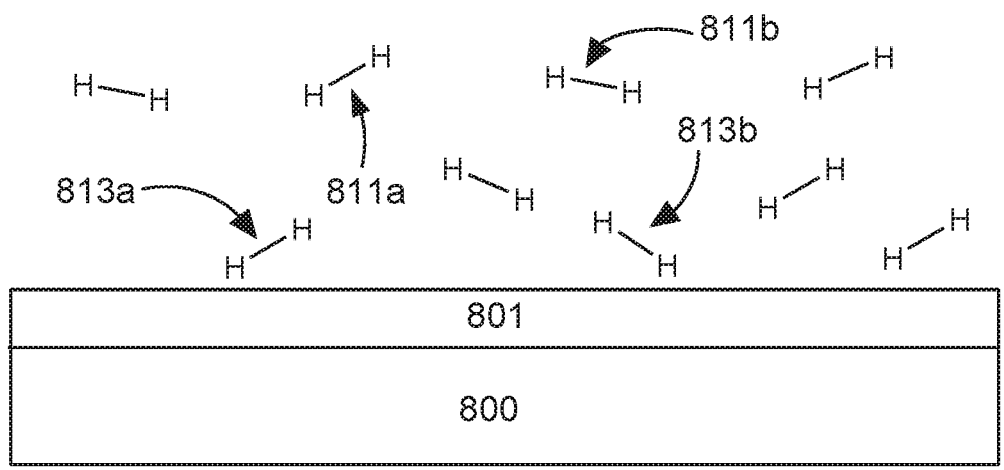
FIGS. 8A-8J are schematic diagrams of an example of a mechanism for depositing films in accordance with disclosed embodiments.

FIGS. 8A-8J are schematic illustrations of an example mechanism of a deposition cycle. FIG. 8A depicts an example mechanism where a substrate including a TiN layer 800 and a reducing agent layer 801 (e.g., B or B(Si) layer) is exposed to $H_2$. Hydrogen is introduced in gas phase (811a and 811b) and some $H_2$ (813a and 813b) is on the surface of the B or B(Si) layer 801, where it may dissociate into chemically active adsorbed atomic hydrogen or physisorb. For example, $H_2$ may not necessarily chemisorb onto the 401, but in some embodiments, may physisorb onto the surface of the reducing agent layer 801. This can form a solid Si—B—H interfacial surface layer.

Figure 8B:
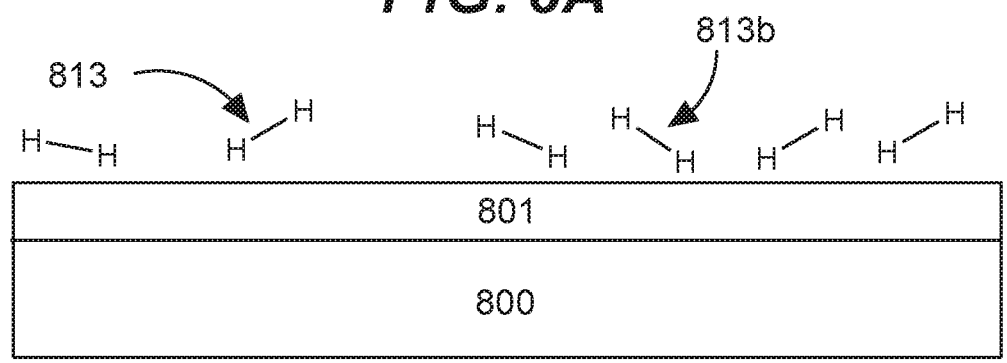

FIG. 8B shows an example illustration whereby $H_2$ previously in gas phase (811a and 811b in FIG. 8A) are purged from the chamber, and $H_2$ previously on the surface (843a and 813b) remain on the surface of the reducing agent 801.

Figure 8C:
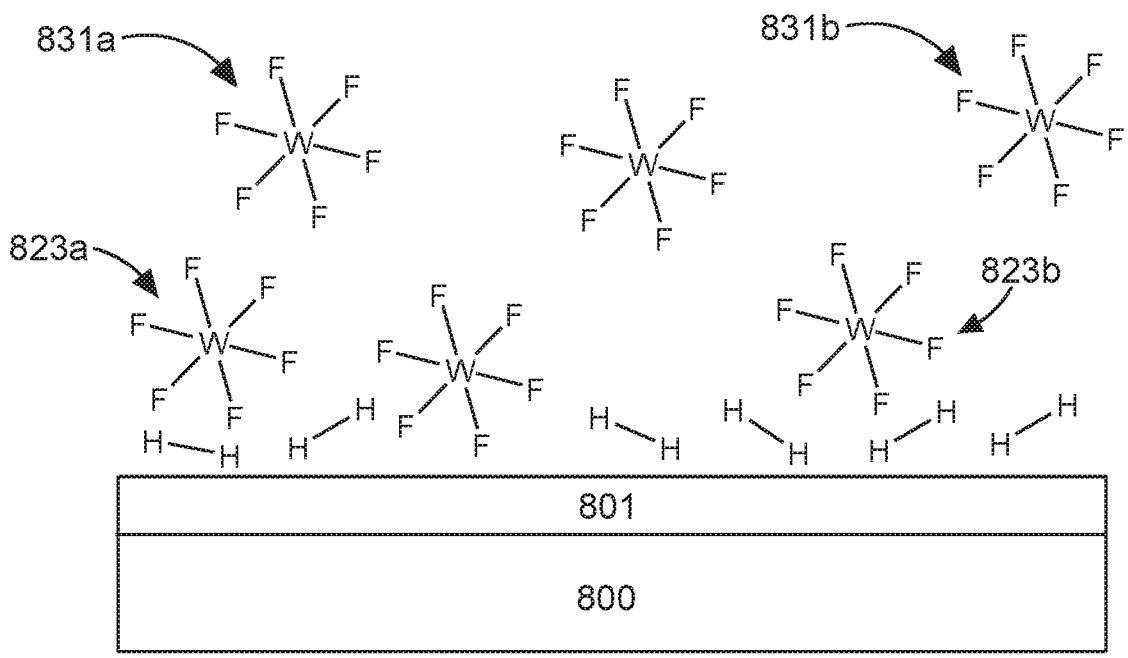

FIG. 8C shows an example schematic illustration whereby the substrate is exposed to $WF_6$, some of which is in gas phase (831a and 831b) and some of which is at or near the surface of the substrate (823a and 823b).

Figure 8D:
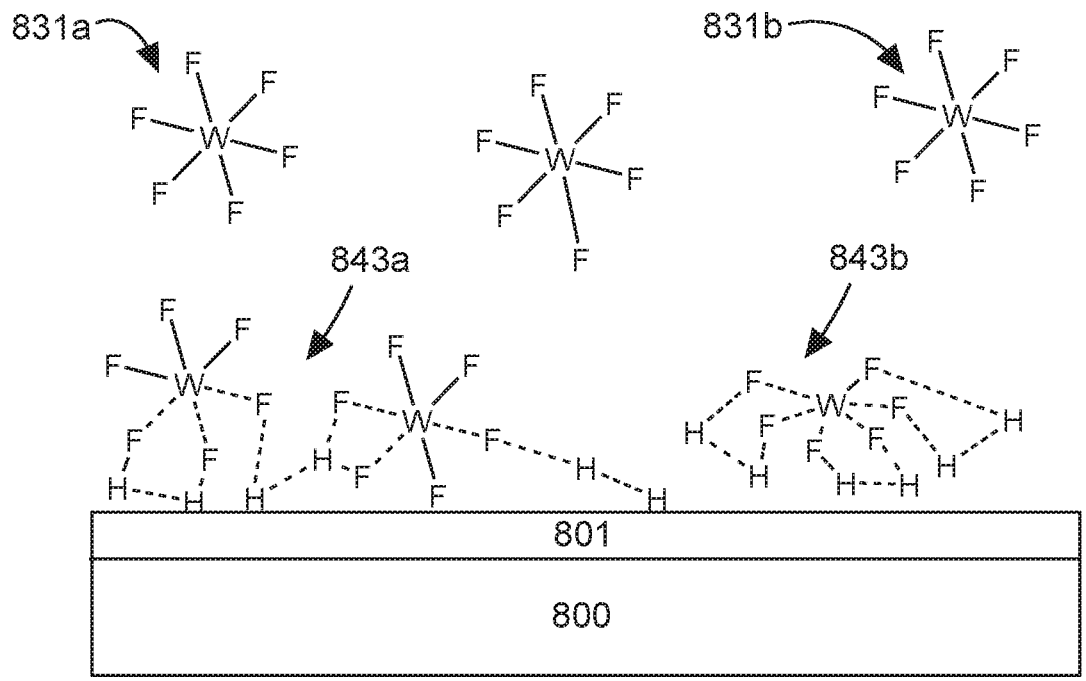
Figure 8E:
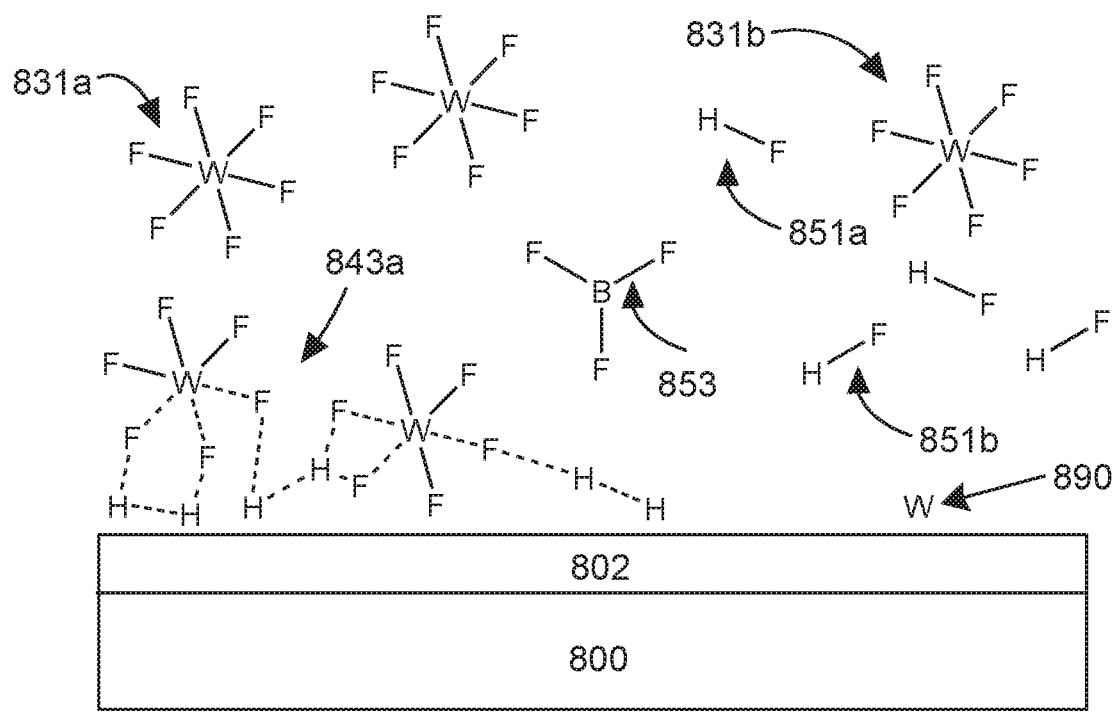

Some $H_2$ may react with $WF_6$ that remained on the surface from the prior dose. In FIG. 8D, $WF_6$ may react with $H_2$ to temporarily form intermediate 843b, whereby in FIG. 8E, intermediate 843b fully reacts to form tungsten 890 and HF in gas phase (851a and 851b, for example). $WF_6$ or an intermediate may also react with B in the reducing agent layer 801 to form $BF_3$ 853. Similarly, $WF_6$ may react with Si in the reducing agent layer 801 to form $SiF_6$ (not shown). As such, a layer 802 including B, Si, H, and W is present.

Some $H_2$ may not fully react with $WF_6$ (or other W fluorides) that remain on the surface from the prior dose. As shown in FIG. 8D, $WF_6$ may partially react with $H_2$ to form intermediate 843a, whereby in FIG. 8E, intermediate 843a remains partially reacted. Film deposited using a fluorine-containing tungsten precursor and hydrogen has a lower resistivity than a film deposited using a borane, silane, or germane. As discussed below, the bulk tungsten films deposited as described herein have low resistivity associated with $H_2$ reduction.

The stoichiometry of $WF_6$ may use at least three $H_2$ molecules to react with one molecule of $WF_6$. It is possible that $WF_6$ partially reacts with molecules of $H_2$ but rather than forming tungsten, an intermediate is formed. For example, this may occur if there is not enough $H_2$ in its vicinity to react with $WF_6$ based on stoichiometric principles (e.g., three $H_2$ molecules are used to react with one molecule of $WF_6$) thereby leaving an intermediate 843a on the surface of the substrate.

Figure 8F:
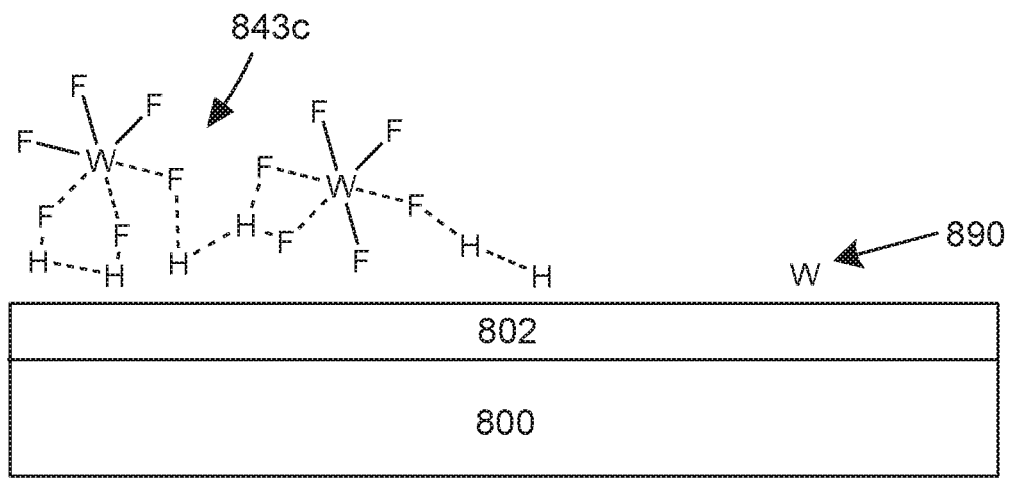

FIG. 8F provides an example schematic of the substrate when the chamber is purged. Note that compound 843c of FIG. 4F may be an intermediate formed but not completely reacted, while some tungsten 890 is present. Each cycle may thereby forms a sub-monolayer of tungsten on the substrate.

Figure 8G:
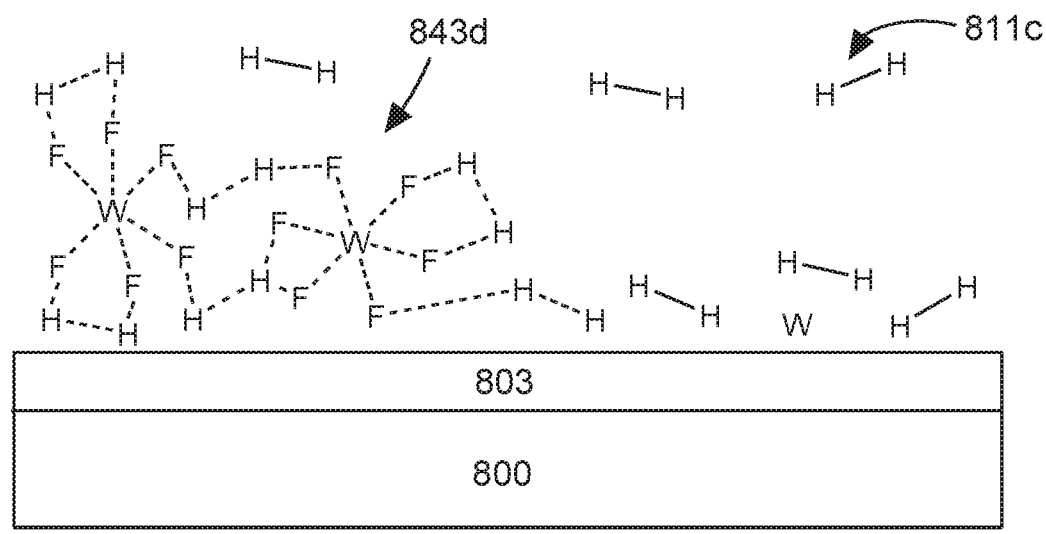
Figure 8H:
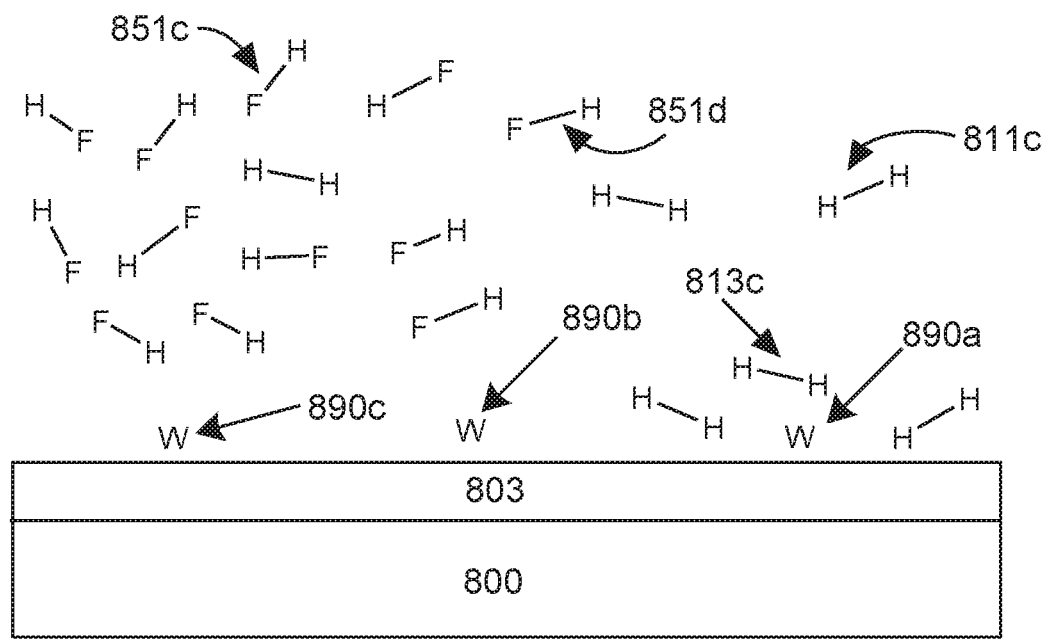

As an example, FIG. 8G shows an illustration where $H_2$ 811c in gas phase is introduced to the substrate with the deposited tungsten 890 and the partially reacted intermediate 843d thereon. At this stage, all of the B or B and Si in the reducing agent layer has been converted, leaving a W film 803. Note that as shown in FIG. 8G, the $H_2$ introduced may now fully react with the intermediate 443d on the substrate such that, as shown in FIG. 8H, the reacted compound 843d leaves behind deposited tungsten 890b and 890c, and byproducts HF 851c and 851d are formed in gas phase. Some $H_2$ 811c may remain in gas phase, while some $H_2$ 813c may remain on the tungsten layer 890a.

Figure 8I:
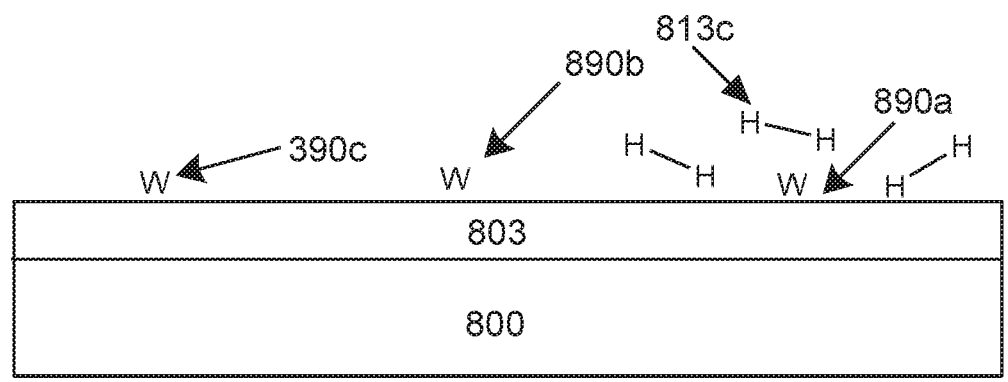
Figure 8J:
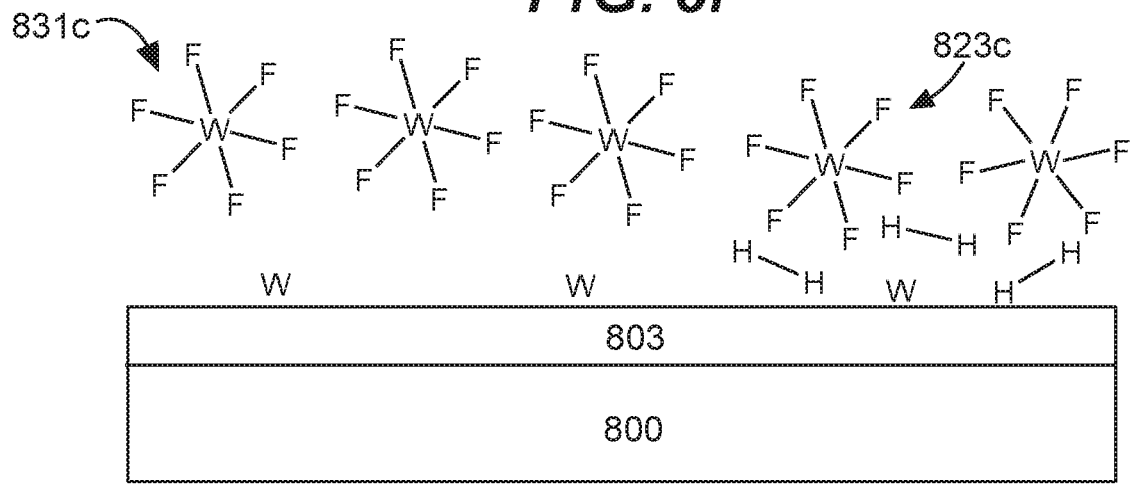

In FIG. 8I, the chamber is purged leaving behind deposited tungsten 490a, 490b, and 490c, and some $H_2$ 413c. In FIG. 8J, $WF_6$ is again introduced in a dose such that molecules 831c and 823c may then adsorb and/or react with $H_2$ and the substrate. $WF_6$ dose, the chamber may again be purged and cycles may be repeated again until the desired thickness of tungsten is deposited.

EXPERIMENTAL

Tungsten bulk layers were deposited on SiOx/TiN using the following processes:
Process A: Deposition of 2-3 nm tungsten nucleation layer on TiN by multiple cycles (4-7) sequential pulses of $B_2H_6$ and $WF_6$ ($B_2H_6$/Ar/$WF_6$/Ar) at 250° C. and 10 Torr. Deposition of tungsten bulk layer on tungsten nucleation layer by sequential pulses of $H_2$ and $WF_6$ ($H_2$/Ar/$WF_6$/Ar) at 300° C. and 10 Torr.
Process B: Deposition of tungsten bulk layer on TiN by one pulse of $B_2H_6$ followed by one pulse of $SiH_4$ followed by sequential pulses of $H_2$ and $WF_6$ ($H_2$/Ar/$WF_6$/Ar) at 300° C. and 10 Torr.

Resistivities at 174 Angstrom film deposited by process A (nucleation) and process B (nucleation free) were measured as 20.2 micro-Ohm-centimeters for the W film deposited by process A (including the nucleation layer) and 17.7 micro-Ohm-centimeters for the nucleation-less film deposited by process B. A resistivity of about 14 micro-Ohm-centimeters was achieved for a nucleation-free deposition using a B reducing agent layer.

Potential issues can arise due to the presence of boron in bulk tungsten films. For example, the presence of boron-10, an isotope of boron, causes integration issues, such as processing defects during chemical mechanical planarization (CMP), or soft error rate defects due to interaction of isotope boron-10 with thermal neutrons. Specifically, boron-10 reacts with chemicals during CMP to form soluble boric acid, which leads to edge erosion, plug pull out, and other defects. Another concern in using boron-containing reducing agents may be its effect on the type of tungsten that forms in the feature. Beta-tungsten has a metastable A15 cubic crystalline structure and exhibits higher resistivity than the stable body-centered cubic crystalline structure of alpha-tungsten. Boron-based nucleation layers may lead to the presence of higher resistivity beta-tungsten—rather than alpha tungsten—in tungsten films.

Figure 7B:
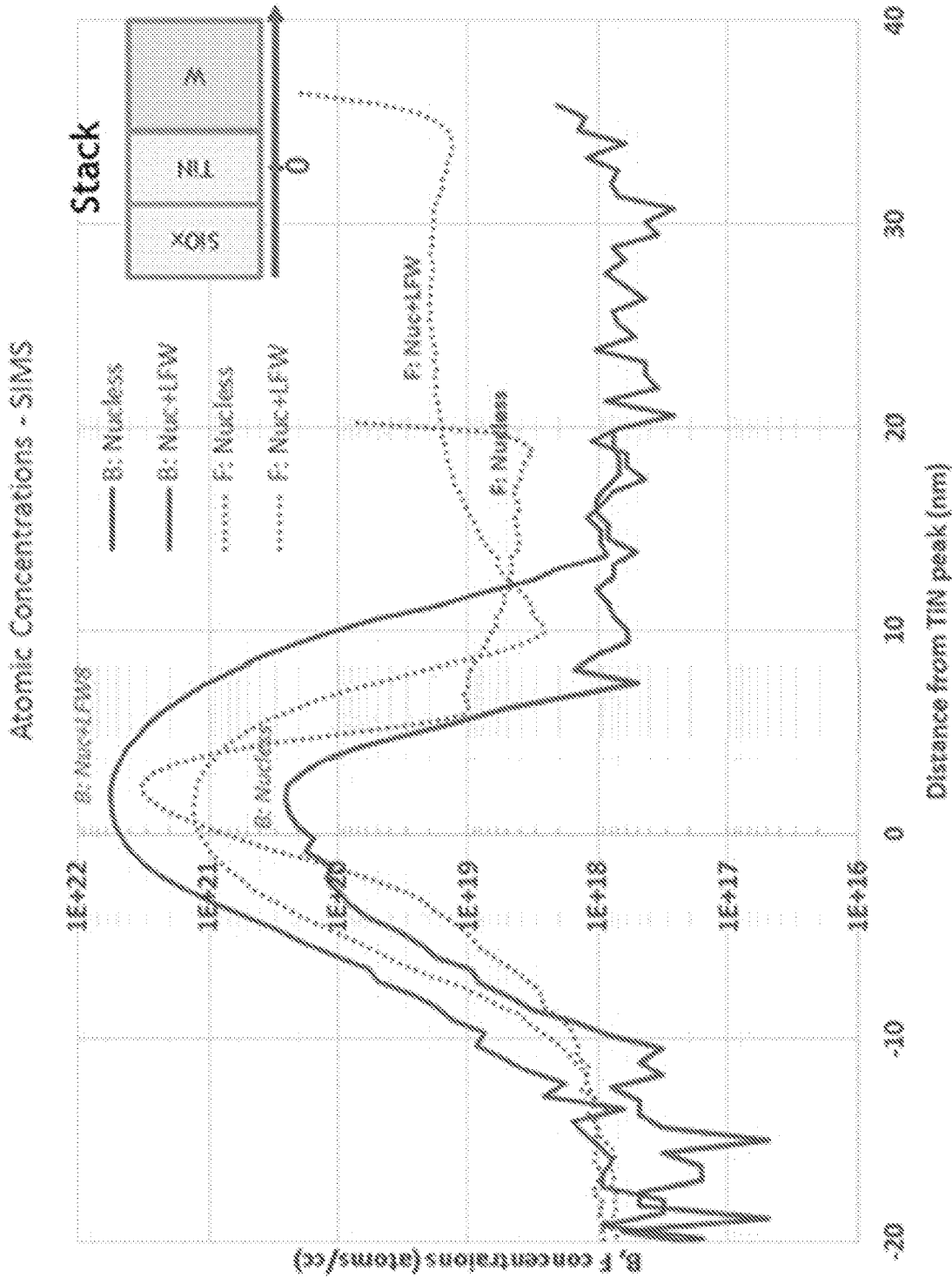
FIG. 7B shows the atomic concentrations of boron and fluorine as a function of depth in a SiOx/TiN/W stack for W films deposited with and without nucleation layers.

FIG. 7B shows the atomic concentrations of boron and fluorine as a function of depth in a SiOx/TiN/W stack for W films deposited with and without nucleation layers. Peak boron concentration for process B (labeled "Nuc+LFW") was about 5E+21 atoms/cm$^3$. Peak boron concentration for process A (labeled "Nucless") was less than 2E+20 atoms/cm$^3$—over a magnitude less than for process A. In some embodiments, the peak boron concentration is less than 1E+21 atoms/cm$^3$, or less than 5E+20 atoms/cm$^3$, or less than 2E+20 atoms/cm$^3$ at the interface of the tungsten layer and the underlying layer.

No interface is observed in the tungsten bulk layer deposited without a nucleation layer. By contrast, a nucleation layer—bulk interface is typically observed for films deposited using a nucleation layer. The bulk tungsten is alpha-tungsten.

Reducing agent layer formation: Results in the below table show the effect of diborane on the decomposition of silane in reducing agent layer formation on an oxide. Formation of the reducing agent layer was performed at 300° C. and 10 Torr using various mixtures of $SiH_4$ and $B_2H_6$ on blanket $SiO_2$. The balance of the reducing agent gas is $H_2$ and $N_2$ carrier gases in each case.

| % $SiH_4$ in Dose | % $B_2H_6$ in Dose | $SiH_4$ Exposure Torr-s | $B_2H_6$ Exposure Torr-s | $SiH_4$:$B_2H_6$ ratio | Dep Rate Å/cycle | % Si in layer | % B in layer | S:B | $SiH_4$ Sticking Coef | $B_2H_6$ Sticking Coef |
|---|---|---|---|---|---|---|---|---|---|---|
| 50% | 0 | 25 | 0 | ∞ | <5.0 discontinuous | 100% | 0% | ∞ | 3.7E−7 | N/A |
| 45% | 0.25% | 22.5 | 0.125 | 180 | 17.1 | 76% | 24% | 3 | 2.4E−6 | 1.3E−5 |
| 25% | 1.25% | 12.5 | 0.625 | 20 | 18.0 | 40% | 60% | 0.7 | 1.7E−6 | 2.5E−5 |
| 5% | 2.25% | 2.5 | 1.125 | 2 | 9.4 | 16% | 84% | 0.2 | 1.3E−6 | 3.4E−5 |
| 0% | 2.50% | 0 | 1.250 | 0 | 6.0 | 0% | 100% | 0 | N/A | 1.1E−5 |

The above results show that a small amount of diborane greatly alters the silane decomposition. For example, the silane sticking coefficient is increased almost sevenfold by the addition of just 0.25% diborane. Co-flowing silane also increases the diborane coefficient by greater than twofold. Electron energy loss spectroscopy (EELS) analysis shows that the % B in the reducing agent layer is high relative to the % $B_2H_6$ in the reducing agent gas.

Grain size and orientation of tungsten was measured for different conditions of thermally decomposing diborane to form the boron layer.

| Process | Soak Temperature (C.) | Soak Pressure (T) | B2H6 dose time (s) | H2 flow (sccm) | Texture from XRD | Average Crystallite size (nm) |
|---|---|---|---|---|---|---|
| A | 250 | 20 | 30 | 0 | 200 - 84.5% | 18.7 ± 3.0 |
| B | 250 | 20 | 30 | 5000 | 200 - 81.9% | 21.9 ± 3.7 |
| C | 250 | 20 | 120 | 0 | Random - 68.8% | 19.9 ± 4.0 |
| D | 250 | 20 | 120 | 5000 | 200 - 83.9% | 15.8 ± 7.3 |
| E | 250 | 50 | 30 | 5000 | 200 - 88.4% | 17.3 ± 3.7 |
| F | 250 | 50 | 120 | 0 | Random - 82.1% | 23.9 ± 3.9 |
| G | 250 | 50 | 120 | 5000 | 200 - 79.2% | 16.9 ± 4.2 |
| H | 275 | 35 | 66.5 | 2500 | 200 - 84.6% | 16.9 ± 4.1 |
| I | 300 | 20 | 15 | 0 | 200 - 75% | 12.0 ± 3.8 |
| J | 300 | 50 | 90 | 0 | Random - 76.7% | 23.4 ± 3.3 |
| K | 300 | 50 | 90 | 5000 | Random - 71.9% | 21.4 ± 3.4 |

The results demonstrate that a higher B content results in larger grain size and a more random grain orientation. They further demonstrate that grain orientation and/or size may be tuned by 1) adjusting $H_2$ (compare A and B; C and D; F and G; J and K) with lower $H_2$ generally resulting in larger and more random orientation; 2) adjusting diborane dose time (compare A and C; B and D; E and G); and 3) adjusting pressure (compare B and E; C and F; D and G).

In some embodiments, random orientation may not be avoided as it leads to high tensile stress. The grain size may be larger with random orientation, which reduces resistivity.

Apparatus

Any suitable chamber may be used to implement the disclosed embodiments. Example deposition apparatuses include various systems, e.g., ALTUS® and ALTUS® Max, available from Lam Research Corp., of Fremont, California, or any of a variety of other commercially available processing systems. In some embodiments, deposition of a reducing agent layer may be performed at a first station that is one of two, five, or even more deposition stations positioned within a single deposition chamber. Thus, for example, silane ($SiH_4$) and diborane ($B_2H_6$) may be introduced to the surface of the semiconductor substrate, at the first station, using an individual gas supply system that creates a localized atmosphere at the substrate surface to form a reducing agent layer. Another station may be used for tungsten conversion of the reducing agent layer. In the same or other embodiments, two or more stations may be used to fill the features with bulk tungsten in parallel processing.

Figure 9:
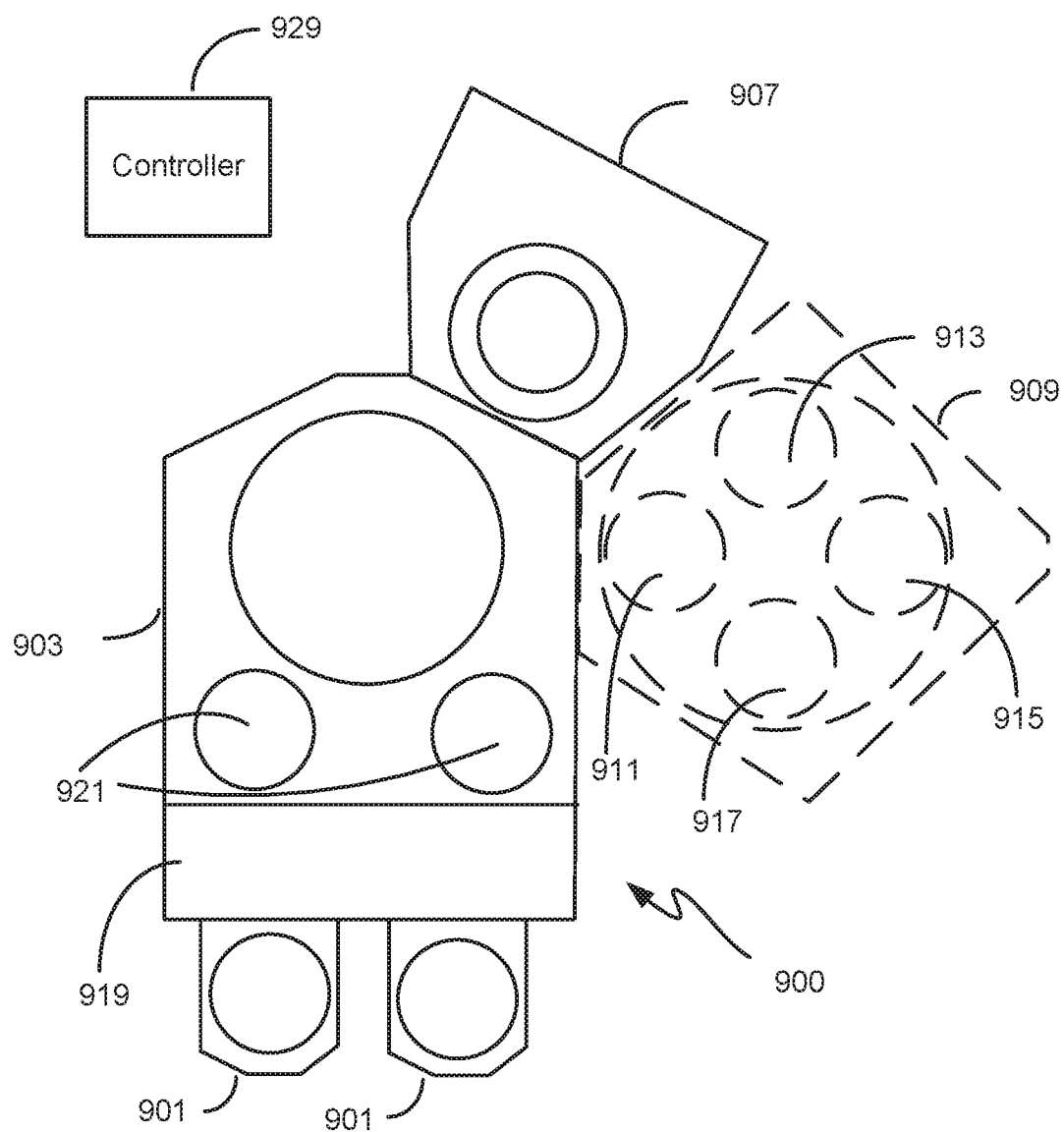
FIG. 9 is a schematic diagram of an example process tool for performing disclosed embodiments.
Figure 10:
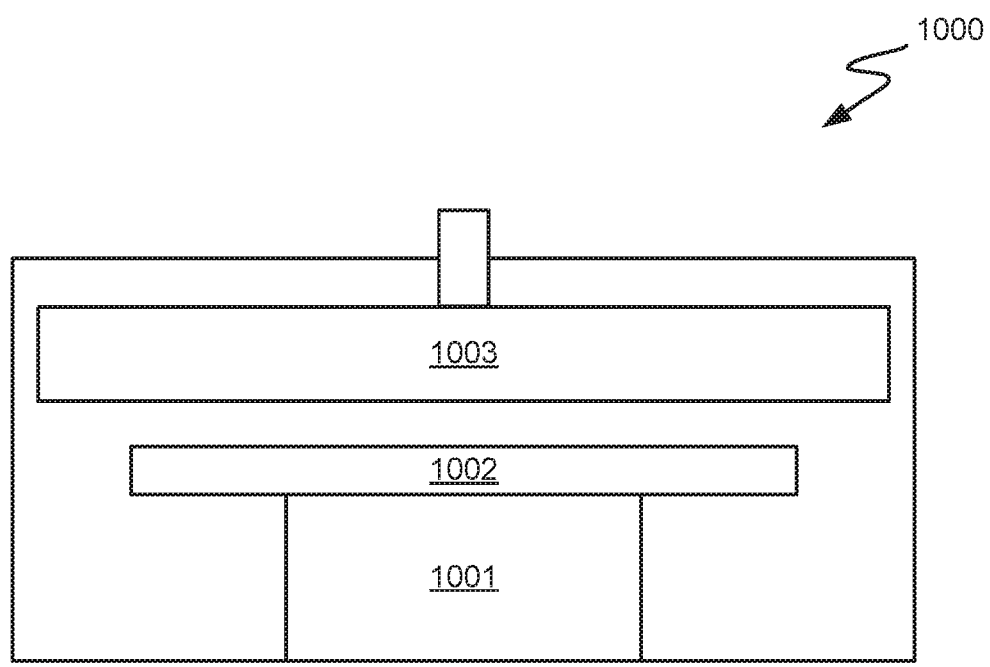
FIG. 10 is a schematic diagram of an example station for performing disclosed embodiments.

FIG. 9 is a block diagram of a processing system suitable for conducting deposition processes in accordance with embodiments. The system 900 includes a transfer module 903. The transfer module 903 provides a clean, pressurized environment to minimize risk of contamination of substrates being processed as they are moved between various reactor modules. Mounted on the transfer module 903 is a multi-station reactor 909. Multi-station reactor 909 may also be used to perform reducing agent layer deposition, tungsten conversion, and subsequent CVD in some embodiments. Reactor 909 may include multiple stations 911, 913, 915, and 917 that may sequentially perform operations in accordance with disclosed embodiments. For example, reactor 909 could be configured such that station 911 performs a first operation using a reducing agent and stations 913, 915, and 917 perform operations pulsing $WF_6$ and $H_2$. Each station may include a heated pedestal or substrate support for independent temperature control, one or more gas inlets or showerhead or dispersion plate. An example of a deposition station 1000 is depicted in FIG. 10, including substrate support 1002 and showerhead 1003. A heater may be provided in pedestal portion 1001.

Also mounted on the transfer module 903 may be one or more single or multi-station modules 907 capable of performing plasma or chemical (non-plasma) pre-cleans. The module may also be used for various treatments to, for example, prepare a substrate for a deposition process. The system 900 also includes one or more wafer source modules 901, where wafers are stored before and after processing. An atmospheric robot (not shown) in the atmospheric transfer chamber 919 may first remove wafers from the source modules 901 to loadlocks 921. A wafer transfer device (generally a robot arm unit) in the transfer module 903 moves the wafers from loadlocks 921 to and among the modules mounted on the transfer module 903.

In various embodiments, a system controller 929 is employed to control process conditions during deposition. The controller 929 will typically include one or more memory devices and one or more processors. A processor may include a CPU or computer, analog and/or digital input/output connections, stepper motor controller boards, etc.

The controller 929 may control all of the activities of the deposition apparatus. The system controller 929 executes system control software, including sets of instructions for controlling the timing, mixture of gases, chamber pressure, chamber temperature, wafer temperature, wafer chuck or pedestal position, and other parameters of a particular process. Other computer programs stored on memory devices associated with the controller 929 may be employed in some embodiments.

Typically there will be a user interface associated with the controller 929. The user interface may include a display screen, graphical software displays of the apparatus and/or process conditions, and user input devices such as pointing devices, keyboards, touch screens, microphones, etc.

System control logic may be configured in any suitable way. In general, the logic can be designed or configured in hardware and/or software. The instructions for controlling the drive circuitry may be hard coded or provided as software. The instructions may be provided by "programming." Such programming is understood to include logic of any form, including hard coded logic in digital signal processors, application-specific integrated circuits, and other devices which have specific algorithms implemented as hardware. Programming is also understood to include software or firmware instructions that may be executed on a general purpose processor. System control software may be coded in any suitable computer readable programming language.

The computer program code for controlling the germanium-containing reducing agent pulses, hydrogen flow, and tungsten-containing precursor pulses, and other processes in a process sequence can be written in any computer readable programming language: for example, assembly language, C, C++, Pascal, Fortran, or others. Compiled object code or script is executed by the processor to perform the tasks identified in the program. Also as indicated, the program code may be hard coded.

The controller parameters relate to process conditions, such as, for example, process gas composition and flow rates, temperature, pressure, cooling gas pressure, substrate temperature, and chamber wall temperature. These parameters are provided to the user in the form of a recipe, and may be entered utilizing the user interface.

Signals for monitoring the process may be provided by analog and/or digital input connections of the system controller 929. The signals for controlling the process are output on the analog and digital output connections of the deposition apparatus 900.

The system software may be designed or configured in many different ways. For example, various chamber component subroutines or control objects may be written to control operation of the chamber components necessary to carry out the deposition processes in accordance with the disclosed embodiments. Examples of programs or sections of programs for this purpose include substrate positioning code, process gas control code, pressure control code, and heater control code.

In some implementations, a controller 929 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller 929, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings in some systems, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller 929, in some implementations, may be a part of or coupled to a computer that is integrated with, coupled to the system, otherwise networked to the system, or a combination thereof. For example, the controller 929 may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a CVD chamber or module, an ALD chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

The controller 929 may include various programs. A substrate positioning program may include program code for controlling chamber components that are used to load the substrate onto a pedestal or chuck and to control the spacing between the substrate and other parts of the chamber such as a gas inlet and/or target. A process gas control program may include code for controlling gas composition, flow rates, pulse times, and optionally for flowing gas into the chamber prior to deposition in order to stabilize the pressure in the chamber. A pressure control program may include code for controlling the pressure in the chamber by regulating, e.g., a throttle valve in the exhaust system of the chamber. A heater control program may include code for controlling the current to a heating unit that is used to heat the substrate. Alternatively, the heater control program may control delivery of a heat transfer gas such as helium to the wafer chuck.

Examples of chamber sensors that may be monitored during deposition include mass flow controllers, pressure sensors such as manometers, and thermocouples located in the pedestal or chuck. Appropriately programmed feedback and control algorithms may be used with data from these sensors to maintain desired process conditions.

The foregoing describes implementation of disclosed embodiments in a single or multi-chamber semiconductor processing tool. The apparatus and process described herein may be used in conjunction with lithographic patterning tools or processes, for example, for the fabrication or manufacture of semiconductor devices, displays, LEDs, photovoltaic panels, and the like. Typically, though not necessarily, such tools/processes will be used or conducted together in a common fabrication facility. Lithographic patterning of a film typically includes some or all of the following steps, each step provided with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

In the description above and in the claims, numerical ranges are inclusive of the end points of the range. For example, "between about 10 and 50 Angstroms thick" includes 10 Angstroms and 50 Angstroms. Similarly, ranges represented by a dash are inclusive of the end points of the ranges.

In the foregoing description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments. It will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. A method comprising:
    depositing an elemental tungsten bulk layer without depositing a tungsten nucleation layer on a surface of a substrate by:
        forming a layer comprising elemental boron (B) on the surface; and
        after forming the layer, performing multiple cycles of exposing the substrate to alternating pulses of a tungsten fluoride compound and hydrogen ($H_2$) to thereby form the elemental tungsten bulk layer on the surface.

2. The method of claim 1, wherein a B content at an interface of the elemental tungsten bulk layer and the surface is no more than $10^{21}$ atoms/cm$^3$.

3. The method of claim 1, wherein a B content at an interface of the elemental tungsten bulk layer and the surface is no more than $5 \times 10^{20}$ atoms/cm$^3$.

4. The method of claim 1, wherein a B content at an interface of the elemental tungsten bulk layer and the surface is no more than $2 \times 10^{20}$ atoms/cm$^3$.

5. The method of claim 1, wherein the layer comprising elemental boron is between 10 and 50 Angstroms thick.

6. The method of claim 1, wherein the layer comprising elemental boron is less than 30 Angstroms thick.

7. The method of claim 1, wherein the layer comprising elemental boron consists essentially of boron.

8. The method of claim 1, wherein the layer comprising elemental boron further comprises silicon.

9. The method of claim 1, wherein the surface is a nitride surface.

10. The method of claim 1, wherein the surface is a titanium nitride surface.

11. The method of claim 1, wherein the surface is an oxide surface.

12. The method of claim 1, wherein forming the layer comprising elemental boron comprises exposing the surface to diborane.

13. The method of claim 1, wherein forming the layer comprising elemental boron comprises exposing the surface to diborane and silane.

14. The method of claim 1, wherein a chamber pressure of a chamber housing the substrate during the forming a layer comprising elemental boron (B) is between 10 Torr and 90 Torr.

15. The method of claim 1, wherein the forming a layer comprising elemental boron (B) and the performing multiple cycles are performed in a same chamber.

16. The method of claim 15, comprising lowering a chamber pressure after forming the layer comprising elemental boron and prior to performing the multiple cycles.

17. The method of claim 1, wherein forming the layer comprising elemental boron (B) on the surface comprises exposing the surface to a gas mixture comprising boron (B) and silicon (Si) wherein a B:Si ratio is between 1:1 and 6:1.

18. The method of claim 17, wherein the gas mixture comprises diborane and silane.

19. The method of claim 1, wherein the forming the layer comprising elemental boron (B) on the surface comprises thermal decomposition of a boron-containing reducing agent without adsorption of the boron-containing reducing agent on the surface.

20. The method of claim 1, wherein the layer of elemental boron conforms to a topography of the surface.

* * * * *